(12) United States Patent
Feldmann et al.

(10) Patent No.: US 8,068,276 B2
(45) Date of Patent: Nov. 29, 2011

(54) PROJECTION OBJECTIVE FOR LITHOGRAPHY

(75) Inventors: Heiko Feldmann, Aalen (DE); Susanne Beder, Aalen (DE); Aurelian Dodoc, Heidenheim (DE); Alexander Epple, Aalen (DE); Hans-Juergen Rostalski, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 12/899,297

(22) Filed: Oct. 6, 2010

(65) Prior Publication Data

US 2011/0026110 A1    Feb. 3, 2011

Related U.S. Application Data

(63) Continuation of application No. 12/014,496, filed on Jan. 15, 2008, now Pat. No. 7,835,073.

(30) Foreign Application Priority Data

Jan. 23, 2007   (DE) .................. 10 2007 005 564

(51) Int. Cl.
    *G02B 17/08* (2006.01)
(52) U.S. Cl. ....................... 359/364; 359/362

(58) Field of Classification Search .................. 359/364, 359/362
    See application file for complete search history.

(56) References Cited

U.S. PATENT DOCUMENTS

| 5,677,757 | A | 10/1997 | Taniguchi et al. | |
| 7,835,073 | B2 * | 11/2010 | Feldmann et al. | ............ 359/364 |
| 2006/0056064 | A1 | 3/2006 | Shafer et al. | |
| 2006/0087633 | A1 | 4/2006 | Omura et al. | |
| 2006/0256447 | A1 | 11/2006 | Dodoc | |
| 2007/0019305 | A1 | 1/2007 | Ulrich et al. | |

FOREIGN PATENT DOCUMENTS

| EP | 1746463 | 1/2007 |
| JP | 2007 013179 | 1/2007 |
| WO | WO 2004/019128 | 3/2004 |
| WO | WO 2004/097911 | 11/2004 |
| WO | WO 2006/055471 | 5/2006 |
| WO | WO 2006/121008 | 11/2006 |

* cited by examiner

*Primary Examiner* — Joshua L Pritchett
(74) *Attorney, Agent, or Firm* — Fish & Richardson P.C.

(57) ABSTRACT

In some embodiments, a projection objective for lithography includes an optical arrangement of optical elements between an object plane and an image plane. The arrangement generally has at least one intermediate image plane, the arrangement further having at least two correction elements for correcting aberrations, of which a first correction element is arranged optically at least in the vicinity of a pupil plane and a second correction element is arranged in a region which is not optically near either a pupil plane or a field plane.

20 Claims, 7 Drawing Sheets

PROJECTION OBJECTIVE FOR LITHOGRAPHY

CROSS-REFERENCE TO RELATED APPLICATION

This application is a continuation of U.S. application Ser. No. 12/014,496, filed Jan. 15, 2008, which claims priority under 35 U.S.C. §119 of German patent application serial number 10 2007 005 564.3 filed on Jan. 23, 2007, which is hereby incorporated by reference.

FIELD

The disclosure relates to a projection objective for lithography.

BACKGROUND

A projection objective is commonly used in the field of lithographic, in particular microlithographic production of semiconductors, during which an object provided with a structure, which is also denoted as a reticle, is imaged using the projection objective onto a substrate which is denoted as a wafer. The object provided with the structure is typically arranged in an object plane of the projection objective, and the substrate (wafer) is arranged in an image plane of the projection objective. The substrate is often provided with a photosensitive layer upon the exposure of which via light through the projection objective the structure of the object is transferred onto the photosensitive layer. The desired structure can arise on the substrate after development of the photosensitive layer, the exposure operation being multiply repeated, depending on circumstances.

Various designs of projection objectives are known and include dioptric projection objectives (refractive elements and no reflective elements), catoptric projection objectives (reflective elements and no refractive elements) and catadioptric projection objectives (refractive elements and reflective elements).

SUMMARY

The disclosure relates to a projection objective for lithography. The projection objective can have at least one intermediate image plane between the object plane and the image plane. An intermediate image of the object to be imaged and which is arranged in the object plane can be produced in the intermediate image plane.

Both the intrinsic aberrations and those occurring during operation can assume various field profiles in the image plane of the projection objective. It is possible in this case to distinguish between field-constant aberrations and field-dependent (i.e. not field-constant) aberrations. In some embodiments, both the field-constant and the field-dependent aberrations can be measured and/or corrected during operation of the projection objective. Optionally, this can be done with the aid of as few design measures as possible. In certain embodiments, the present disclosure provides a projection objective that can measure for correcting aberrations with both a field-constant profile and with a field-dependent profile with the aid of a low outlay on design.

The disclosure provides a projection objective of a lithographic projection exposure machine, including an optical arrangement of optical elements between an object plane and an image plane, the arrangement having at least one intermediate image plane, the arrangement further having at least two correction elements for correcting aberrations, of which a first correction element is arranged optically at least in the vicinity of a pupil plane and a second correction element is arranged in a region which is not optically near either a pupil plane or a field plane.

In the case of the projection objective whose optical arrangement of optical elements has at least one intermediate image plane between the object plane and the image plane, at least two correction elements for correcting aberrations (e.g., exactly two correction elements for correcting aberrations or exactly three correction elements for correcting aberrations), which are arranged at specific positions of the projection objective, can be provided as measures for correcting aberrations. The first correction element can be optically arranged in this case at least in the vicinity of a pupil plane. It is also to be understood in this context that the first correction element can also be arranged exactly in a pupil plane of the projection objective. Since the optical action of an optical element in a pupil plane in the image plane of the projection objective exhibits an approximately field-constant profile, the first correction element can be used to correct aberrations with a field-constant profile.

The second correction element, by contrast, can be arranged in an intermediate region, that is to say a region which is not optically near either a pupil plane or a field plane. An optical element which is arranged in such an intermediate region between pupil and field exhibits on the profile of the image in the image plane an optical action which has both field-constant and field-dependent components. The second correction element can therefore be used to attack aberrations having a profile which is at least also field dependent.

Alongside the at least one intermediate image plane, a field plane is also to be understood here as the object plane and the image plane. A projection objective according to the disclosure therefore has at least three field planes.

The term "optically near" is to be understood to mean that the position of the first or second correction element is not a matter of the spatial position with reference to the pupil plane or to the field plane, but refers to the optical action of this position. An "optically near" position is therefore not defined by the spatial distance of this position from the pupil plane or the field plane, the essential point being, rather, the optical action exerted by an optical element arranged at this position on the imaging into the pupil plane.

In some embodiments, the position of the first correction element is selected such that the absolute value of a ratio of principal-ray height to marginal-ray height at this position is less than $1/n$, where $n=5$, $n=10$, or $n=20$.

Principal-ray height is understood as the ray height of the principal ray of a field point of the object plane with a field height of maximum absolute value. Marginal-ray height is understood as the ray height of a beam of maximum aperture emanating from the center of the field of the object plane. The ratio of principal ray height to marginal ray height at a specific position in the beam path of the projection objective is a criterion which can be used to determine whether the position is located optically in the vicinity of a pupil plane or optically in the vicinity of a field plane. This ratio is zero directly in a pupil plane and very much greater than 1, at least greater than 10, in a field plane. To the extent that the original design of the projection objective of which the corrective measures according to the disclosure are to be provided does not permit a first correction element to be arranged directly in a pupil plane, a search is made in the case of the present refinement for a position at which the ratio of principal ray height to marginal ray height is less than 1/5.

In certain embodiments, the position of the second correction element is selected such that the absolute value of a ratio of principal-ray height to marginal-ray height at this position is greater than 1/m, but less than p/10, where m=20, or m=10, or m=5, and p=55, or p=35, or p=25, or p=20, or p=17.

Such a selection of the position of the second correction element can advantageously ensure that the second correction element is not located optically near either a pupil plane or a field plane.

In some embodiments, in the case in which, seen in the light propagation direction, the arrangement of optical elements includes a first subassembly which images the object plane via a first pupil plane into the intermediate image plane and a second subassembly which images the intermediate image plane via a second pupil plane into the image plane, the first correction element is arranged optically at least in the vicinity of the second pupil plane, and the second correction element is arranged downstream of the intermediate image plane and upstream of the second pupil plane and is not optically near either the intermediate image plane or the second pupil plane.

In some embodiments, in the case in which, seen in the light propagation direction, the arrangement of optical elements includes a first subassembly which images the object plane via a first pupil plane into the intermediate image plane and a second subassembly which images the intermediate image plane via a second pupil plane into the image plane, the first correction element is arranged optically at least in the vicinity of the second pupil plane, and the second correction element is arranged upstream of the first pupil plane and is not optically near either the object plane or the first pupil plane.

In certain embodiments, in the case in which, seen in the light propagation direction, the arrangement of optical elements includes a first subassembly which images the object plane via a first pupil plane into a first intermediate image plane, a second subassembly which images the first intermediate image plane via a second pupil plane into a second intermediate image plane and a third subassembly which images the second intermediate image plane via a third pupil plane into the image plane, the first correction element is arranged optically at least in the vicinity of the first pupil plane, and the second correction element is arranged between the first pupil plane and the first intermediate image plane, and is not optically near either the first pupil plane or the first intermediate image plane.

In some embodiments, in the case in which, seen in the light propagation direction, the arrangement of optical elements includes a first subassembly which images the object plane via a first pupil plane into an intermediate image plane, a second subassembly which images the first intermediate image plane via a second pupil plane into a second intermediate image plane and a third subassembly which images the second intermediate image plane via a third pupil plane into the image plane, the first correction element is arranged optically at least in the vicinity of the first pupil plane, and the second correction element is arranged between the object plane and the first pupil plane, and is not optically near either the object plane or the first pupil plane.

In the context of the previously mentioned refinement of the projection objective it is possible in addition to arrange a third correction element optically at least in the vicinity of the third pupil plane.

In some embodiments, in the case in which, seen in the light propagation direction, the arrangement of optical elements includes a first subassembly which images the object plane via a first pupil plane into a first intermediate image plane, a second subassembly which images the first intermediate image plane via a second pupil plane into a second intermediate image plane and a third subassembly which images the second intermediate image plane via a third pupil plane into the image plane, the first correction element is arranged optically at least in the vicinity of the third pupil plane, and the second correction element is arranged between the object plane and the first pupil plane, and is not optically near either the object plane or the first pupil plane.

In certain embodiments, in the case in which, seen in the light propagation direction, the arrangement of optical elements includes a first subassembly which images the object plane via a first pupil plane into the intermediate image plane and a second subassembly which images the intermediate image plane into the image plane, the first correction element is arranged optically at least in the vicinity of the second pupil plane, and the second correction element is arranged between the object plane and the first pupil plane, and is not optically near the object plane nor the first pupil plane.

In some instances, it can be particularly advantageous when the arrangement includes precisely two correction elements or three correction elements.

The advantage can be that the overall outlay on the correction measures can be kept low, and yet there is a high correction potential in relation to correcting field-constant or field-dependent aberrations.

In certain embodiments, at least one of the correction elements can be exchanged during the operation of the projection objective.

This can allow for relatively quick reaction during operation of the projection objective to aberrations occurring during operation, particularly when there are held ready a plurality of first correction elements and a plurality of second correction elements which, depending on the aberrations which occur, can be exchanged against one another quickly, for example via a quick changer.

In some embodiments, at least one of the correction elements is a plane plate. Optionally, both correction elements can be plane plates.

In certain embodiments, at least one of the correction elements has an aspherization. Optionally, both correction elements can have an aspherization.

In some embodiments, at least one of the correction elements can be actively deformed, and in this case one or more aberrations can corrected by deforming the correction element during operation of the projection objective.

In certain embodiments, at least one of the correction elements can be thermally manipulated.

What is to be understood by this is that the thermally manipulable correction element is connected to a heat source/heat sink via which the correction element can be heated or cooled in order thereby to set the optical action of the correction element to compensate one or more aberrations.

In some embodiments, at least one of the correction elements can be adjusted in position.

Depending on what is desired for the correction potential, the positional adjustment can be restricted to a displacement or a rotation and/or tilting, or can include all possible degrees of freedom of translation and rotation and/or tilting.

Further advantages and features are to be seen from the following description and the attached drawing.

It goes without saying that the abovementioned features, and those still to be explained below, can be used not only in the respectively specified combination, but also in other combinations or on their own without departing from the scope of the present disclosure.

BRIEF DESCRIPTION OF THE DRAWINGS

Exemplary embodiments of the disclosure are illustrated in the drawing and will be explained in more detail below with reference to the drawing, in which.

DETAILED DESCRIPTION

Figure 1:
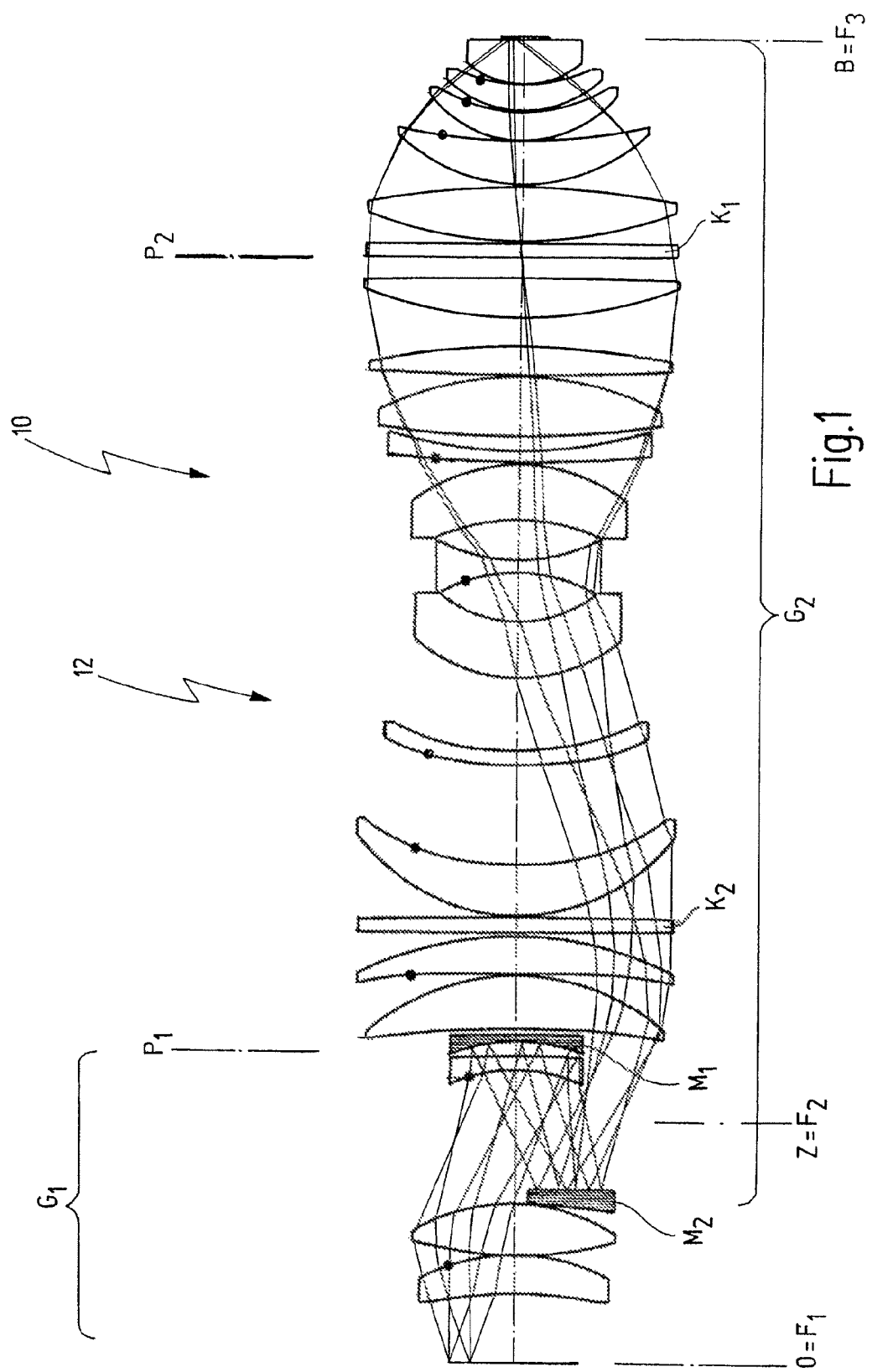
FIG. 1 shows a projection objective.

Illustrated in FIG. 1 is a projection objective which is provided with the general reference 10 and is used for the lithographic production of components.

The projection objective 10 includes an optical arrangement 12 of a plurality of optical elements between an object plane O and an image plane B. The optical arrangement 12 further has an intermediate image plane Z.

Seen in the light propagation direction from the object plane O to the image plane B, the optical arrangement 12 of the projection objective 10 can be subdivided into two subassemblies, specifically a first subassembly $G_1$ and a second subassembly $G_2$.

The first subassembly $G_1$ images the object plane O, or an object arranged therein, via a first pupil plane $P_1$ into the intermediate image plane Z. The first subassembly is catadioptric. It has three lenses and two mirrors $M_1$ and $M_2$. The pupil plane $P_1$ is located approximately at the position of the mirror $M_1$.

The second subassembly $G_2$ is dioptric and images intermediate image Z via a second pupil plane $P_2$ into the image plane B. The second subassembly has a plurality of lenses.

The projection objective 10, which has an intermediate image plane Z, correspondingly has three field planes, specifically the field plane $F_1$ which is formed by the object plane, the field plane $F_2$ which is formed by the intermediate image plane Z, and the field plane $F_3$ which is formed by the image plane B.

The arrangement 12 includes two correction elements $K_1$ and $K_2$ for correcting aberrations.

The first correction element $K_1$ is arranged optically near the second pupil plane $P_2$. In this case, the first correction element $K_1$ is located virtually in the pupil plane $P_2$. The ratio of principal ray height to marginal ray height is virtually zero at the position of the correction element $K_1$.

Seen in the light propagation direction, the second correction element $K_2$ is arranged downstream of the intermediate image plane Z and upstream of the second pupil plane $P_2$, and is not optically near any of these two planes. The ratio of principal ray height to marginal ray height at the position of the correction element $K_2$ is, on the one hand, clearly different from zero, but not substantially greater than one, on the other hand.

The optical data of the projection objective 10 are summarized in Table 1. The basic design of the projection objective without correction elements is, furthermore, described in US 2006/0256447 A1, to which reference is made for further details and which is hereby incorporated by reference.

Figure 2:
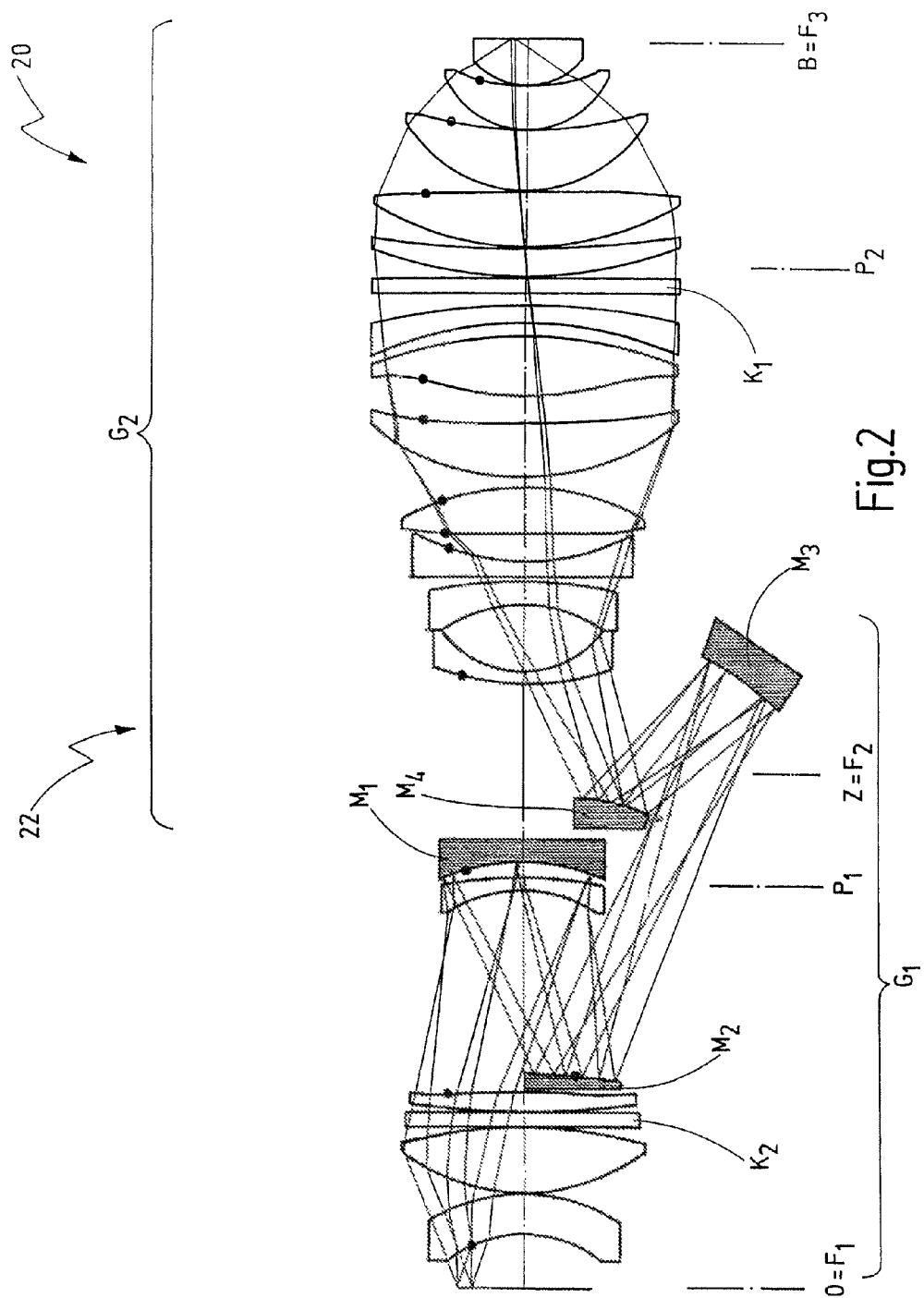
FIG. 2 shows a projection objective.

A projection objective provided with the general reference 20 is illustrated in FIG. 2.

The projection objective 20 has an optical arrangement 22 with a plurality of optical elements between an object plane O and an image plane B. The projection objective 20 has an intermediate image plane Z.

As in the case of the exemplary embodiment in FIG. 1, the arrangement 22 can be subdivided into two subassemblies. A first subassembly $G_1$ which is catadioptric images the object plane O via a first pupil plane $P_1$ into the intermediate image plane Z. The first subassembly $G_1$ includes two mirrors $M_1$ and $M_2$.

A second subassembly $G_2$ images the intermediate image Z via a second pupil plane $P_2$ into the image plane B. The second subassembly $G_2$ has the two mirrors $M_3$ and $M_4$ and a plurality of lenses, and is thus catadioptric.

In order to correct aberrations, arrangement 22 has two correction elements, specifically a first correction element $K_1$ which is arranged optically near the second pupil plane $P_2$, specifically at a position at which there is an adequate interspace between two neighboring lenses.

A second correction element $K_2$ is arranged between the object plane O and the first pupil plane $P_1$, the position of the correction element $K_2$ being selected such that it is not optically near either the pupil plane $P_1$ or the object plane O.

While the ratio of principal ray height to marginal ray height at the position of the correction element $K_1$ is close to zero, this ratio at the position of the correction element $K_2$ is approximately between 0.5 and 2.

The optical data of the projection objective 20 are summarized in Table 2. The basic design of the projection objective 20 without correction elements is, furthermore, described in US 2006/0256447 A1, to which reference is made for further details.

Figure 3:
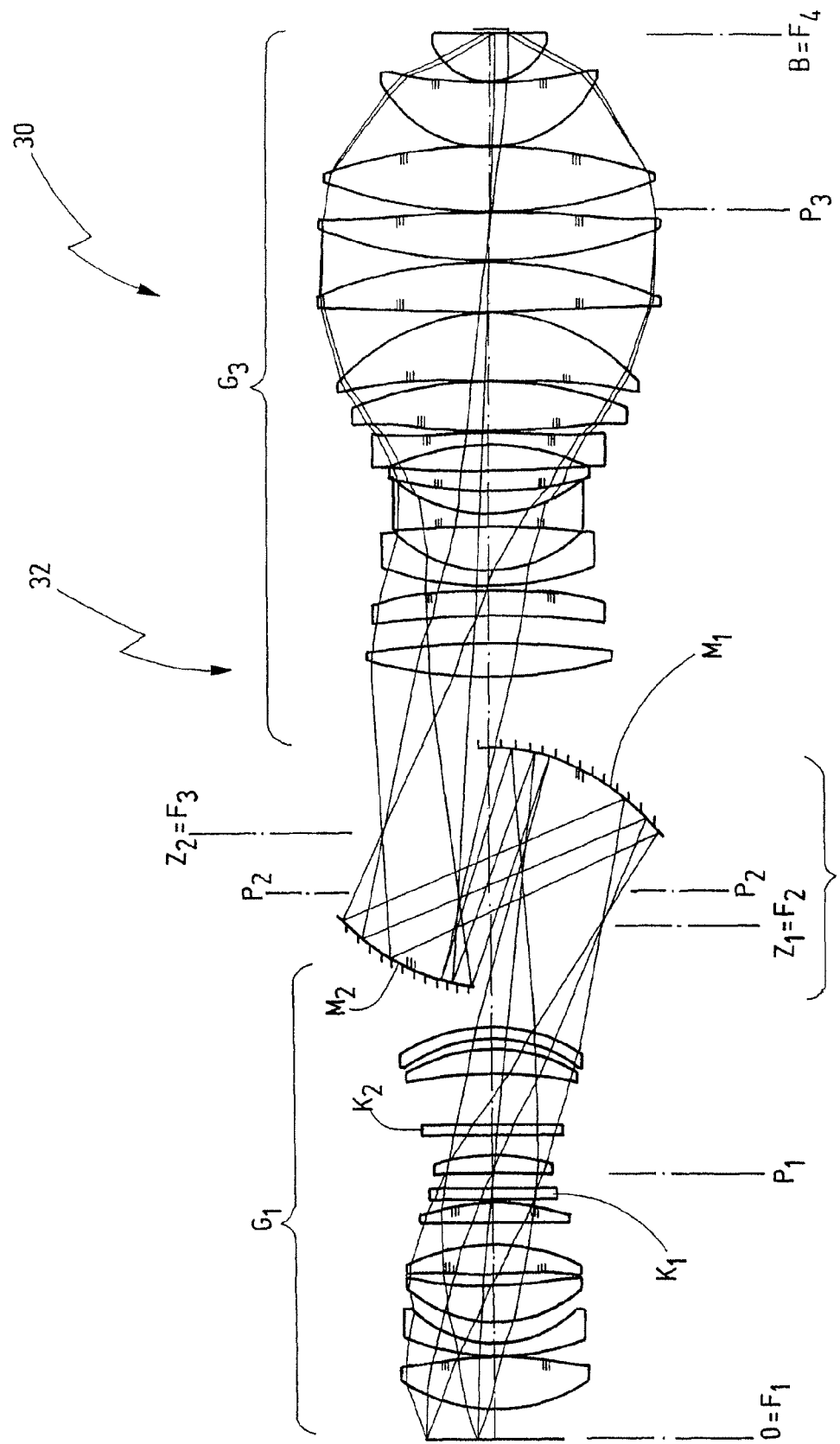
FIG. 3 shows a projection objective.

FIG. 3 shows a further exemplary embodiment of a projection objective 30 according to the disclosure.

The projection objective 30 includes an optical arrangement 32 composed of a plurality of optical elements between an object plane O and an image plane B. The optical elements include lenses and mirrors.

The projection objective 30 has a total of two intermediate image planes $Z_1$ and $Z_2$.

The optical arrangement 32 can be divided overall into three subassemblies $G_1$, $G_2$ and $G_3$.

The first subassembly $G_1$ images the object plane O via a first pupil plane $P_1$ into the first intermediate image plane $Z_1$. The first subassembly $G_1$ is dioptric, that is to say it consists only of refractive elements, here lenses.

The second subassembly $G_2$ is catoptric, that is to say consists only of mirrors, and specifically the mirrors $M_1$ and $M_2$. The second subassembly $G_2$ images the intermediate image plane $Z_1$ via a second pupil plane $P_2$ into the second intermediate image plane $Z_2$.

The third subassembly $G_3$ is again dioptric, that is to say consists only of refractive elements and images the intermediate image plane $Z_2$ into the image plane B.

The projection objective 30 correspondingly has four field planes $F_1$ to $F_4$.

The arrangement 32 further includes a first correction element $K_1$ and a second correction element $K_2$.

The first correction element $K_1$ is located optically near the first pupil plane $P_1$. The second correction element $K_2$ is located between the first pupil plane $P_1$ and the first intermediate image plane $Z_1$, but is not optically near either the first pupil plane $P_1$ or the first intermediate image plane $Z_1$. This results from the fact that although the ratio of principal ray height to marginal ray height is less than 1 at the position of the correction element $K_2$, it is clearly greater than 0, being approximately 0.5.

The optical data of the projection objective 30 are summarized in Table 3. The projection objective 30 without correction elements is further described in WO 2006/055471 A1, to which reference is made for further details and which is hereby incorporated by reference.

Because of the design of the projection objective 30, the third pupil plane $P_3$ or the region around the pupil plane $P_3$ is not recommended for arranging a correction element, since the spacing between neighbouring lenses in this region is too small.

Figure 4:
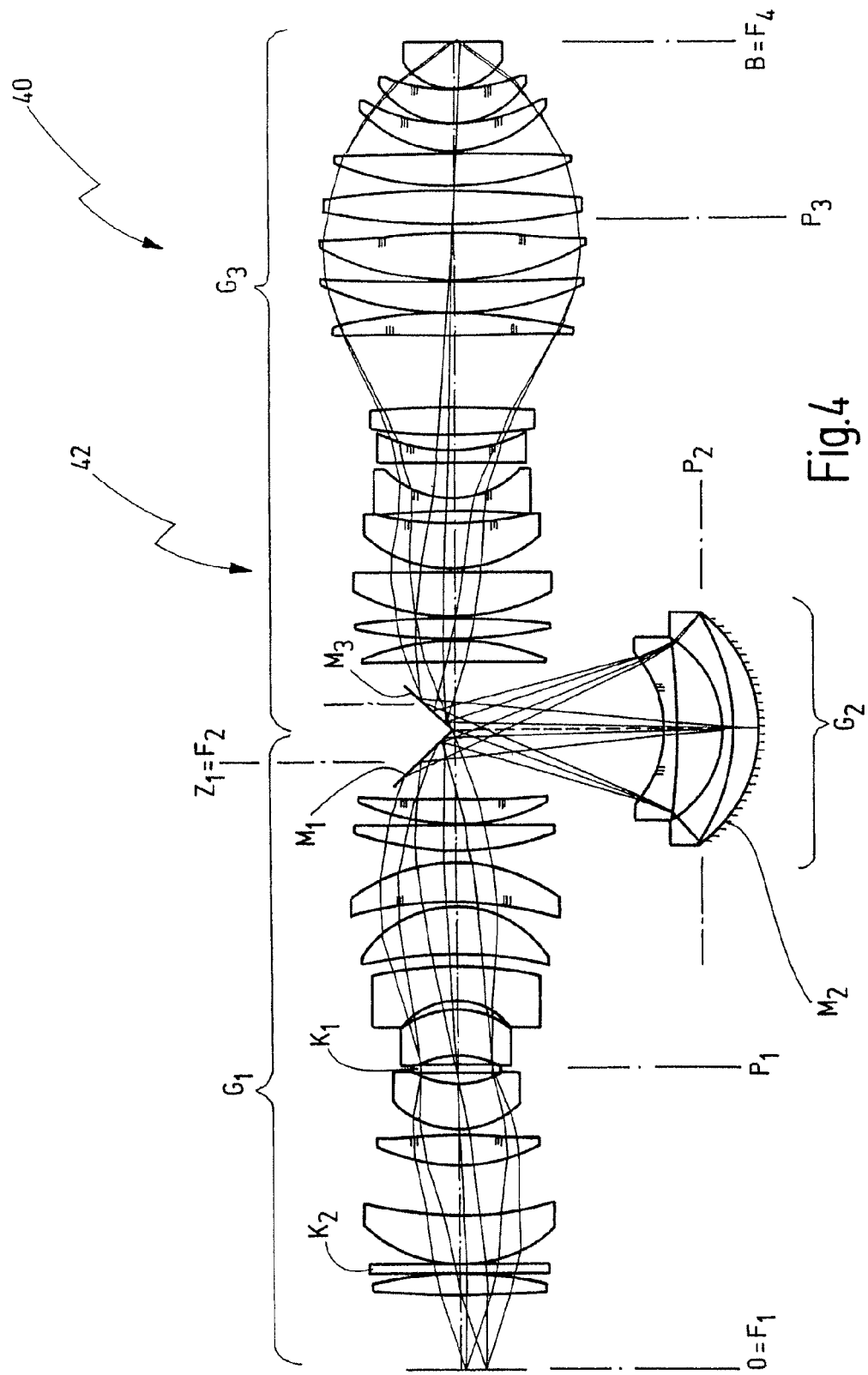
FIG. 4 shows a projection objective.

FIG. 4 shows a further exemplary embodiment of a projection objective 40, which has an optical arrangement 42 composed of a plurality of optical elements, which include lenses and mirrors, between an object plane O and an image plane B.

Like the projection objective 30, the projection objective 40 has two intermediate image planes $Z_1$ and $Z_2$. The projection objective 40 also has four field planes $F_1$ to $F_4$.

Seen in the light propagation direction, the optical arrangement 42 can be divided into the subassemblies $G_1$, $G_2$ and $G_3$.

The first subassembly $G_1$ images the object plane O via a first pupil plane $P_1$ into the first intermediate image plane $Z_1$. The first subassembly $G_1$ is catadioptric and has a mirror $M_1$.

The second subassembly $G_2$ images the first intermediate image plane $Z_1$ via a second pupil plane $P_2$, which is located at the position of a mirror $M_2$, into the second intermediate image plane $Z_2$. The second subassembly $G_2$ is likewise catadioptric. The third subassembly $G_3$ images the second intermediate image plane $Z_2$ via a third pupil plane $P_3$ into the image plane B. The third subassembly $G_3$ has a mirror $M_3$ and a plurality of lenses, and is therefore catadioptric.

The arrangement 42 has two correction elements $K_1$ and $K_2$. The correction element $K_1$ is arranged in the first pupil plane $P_1$, and in the exemplary embodiment shown specifically even exactly in the first pupil plane $P_1$ between two opposite concave lens surfaces.

The second correction element $K_2$ is located between the object plane O and the first pupil plane $P_1$, but is not optically near either the object plane O or the first pupil plane $P_1$. The ratio of principal ray height to marginal ray height is close to 1 at the position of the second correction element $K_2$.

On the basis of its design, the projection objective 40 would also permit the first correction element $K_1$ to be arranged approximately in the third pupil plane $P_3$, since there is an interspace, although slight, between two lenses, which are arranged on both sides of the pupil plane $P_3$. This situation is illustrated in FIG. 5.

Figure 5:
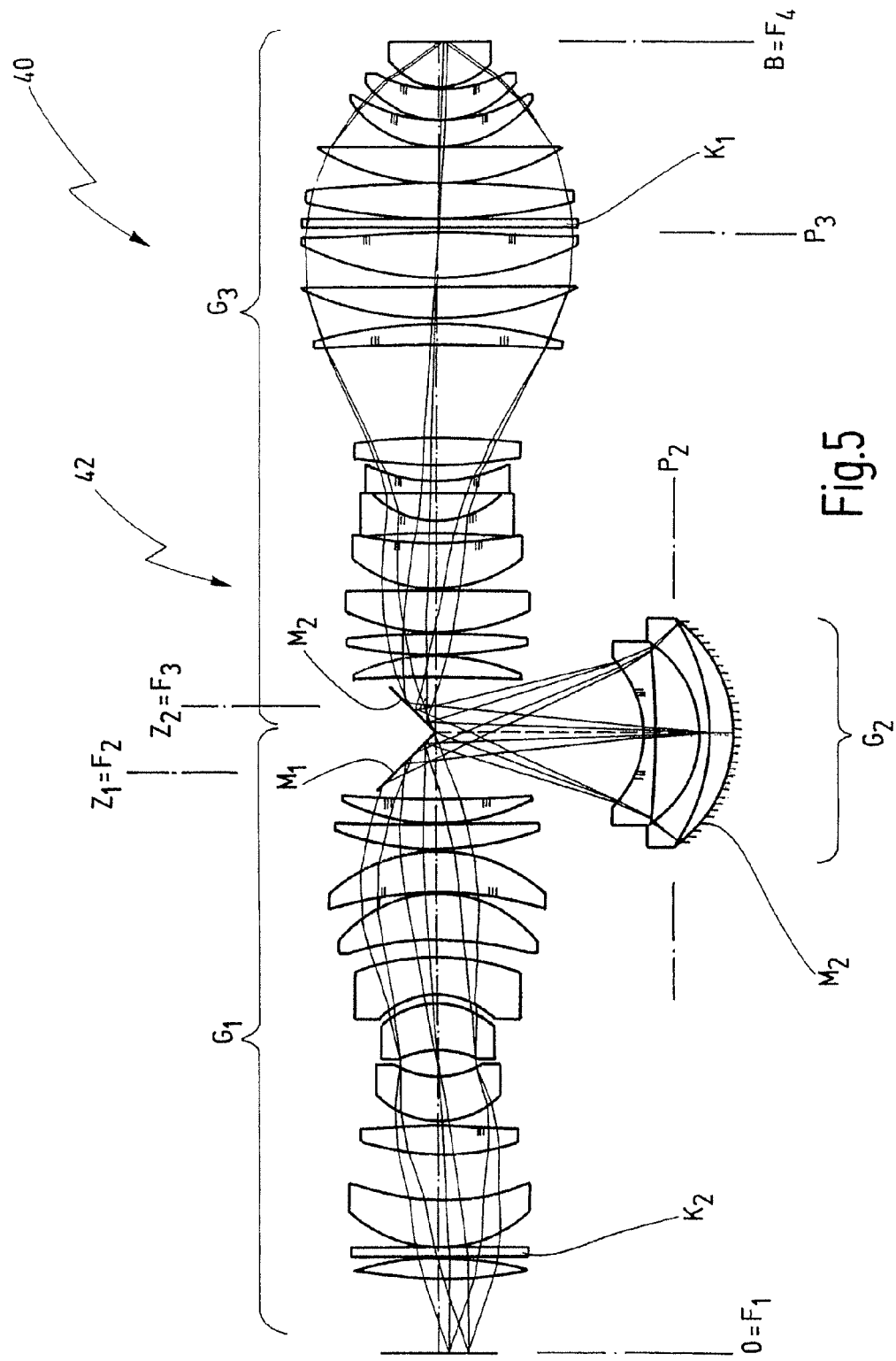
FIG. 5 shows a projection objective.

The optical data of the projection objective 40 in accordance with FIG. 4 are summarized in Table 4, while the optical data of the projection objective 40 in accordance with FIG. 5 with the corresponding other position of the first correction element $K_1$ are summarized in Table 5.

The projection objective 40 in accordance with FIGS. 4 and 5, but without correaction elements, is described, furthermore, in WO 2004/019128, to which reference may be made for further details and which is hereby incorporated by reference.

Figure 6:
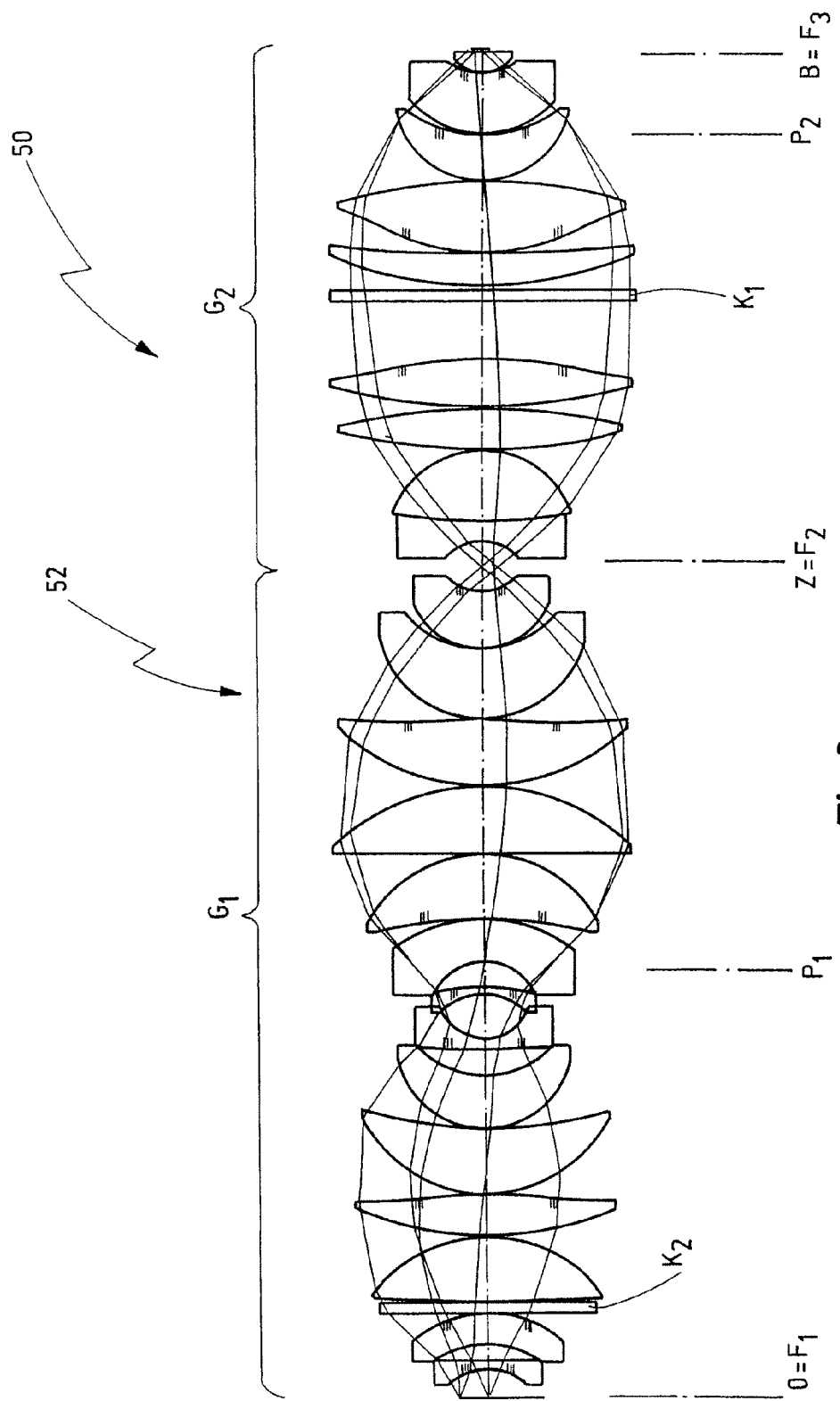
FIG. 6 shows a projection objective.

FIG. 6 shows a further exemplary embodiment of a projection objective 50 which, as distinguished from the previously described projection objectives, is dioptric overall, that is to say is composed only from refractive elements.

The projection objective 50 has an optical arrangement 52 composed of a plurality of optical elements in the form of lenses, which are arranged between an object plane O and an image plane B.

The arrangement 52 has an intermediate image Z, and can be divided into two subassemblies $G_1$ and $G_2$.

The first subassembly $G_1$, which is correspondingly dioptric, images the object plane O via a first pupil plane $P_1$ into the intermediate image plane Z. The second subassembly $G_2$, likewise dioptric, images the intermediate image plane Z via a second pupil plane $P_2$ into the intermediate image plane B.

The arrangement 52 has a total of two correction elements $K_1$ and $K_2$.

The first correction element $K_1$ is arranged optically near the second pupil plane $P_2$. Although the first correction element $K_1$ is spatially separated from the pupil plane $P_2$ by three lenses, the correction element $K_1$ is optically near the pupil plane $P_2$, since the ratio of principal ray height to marginal ray height at the position of the correction element $K_1$ is only slightly different from 0, specifically somewhat smaller than 1/10.

The second correction element $K_2$ is located between the object plane O and the first pupil plane $P_1$, but is not optically near either object plane O or pupil plane $P_1$. The ratio of principal ray height to marginal ray height is only slightly greater than 1 at the position of the correction element $K_2$.

The optical data of the projection objective 50 are summarized in Table 6. Projection objective 50 without correction element is also described US 2006/0056064 A1, to which supplementary reference is made and which is hereby incorporated by reference.

Figure 7:
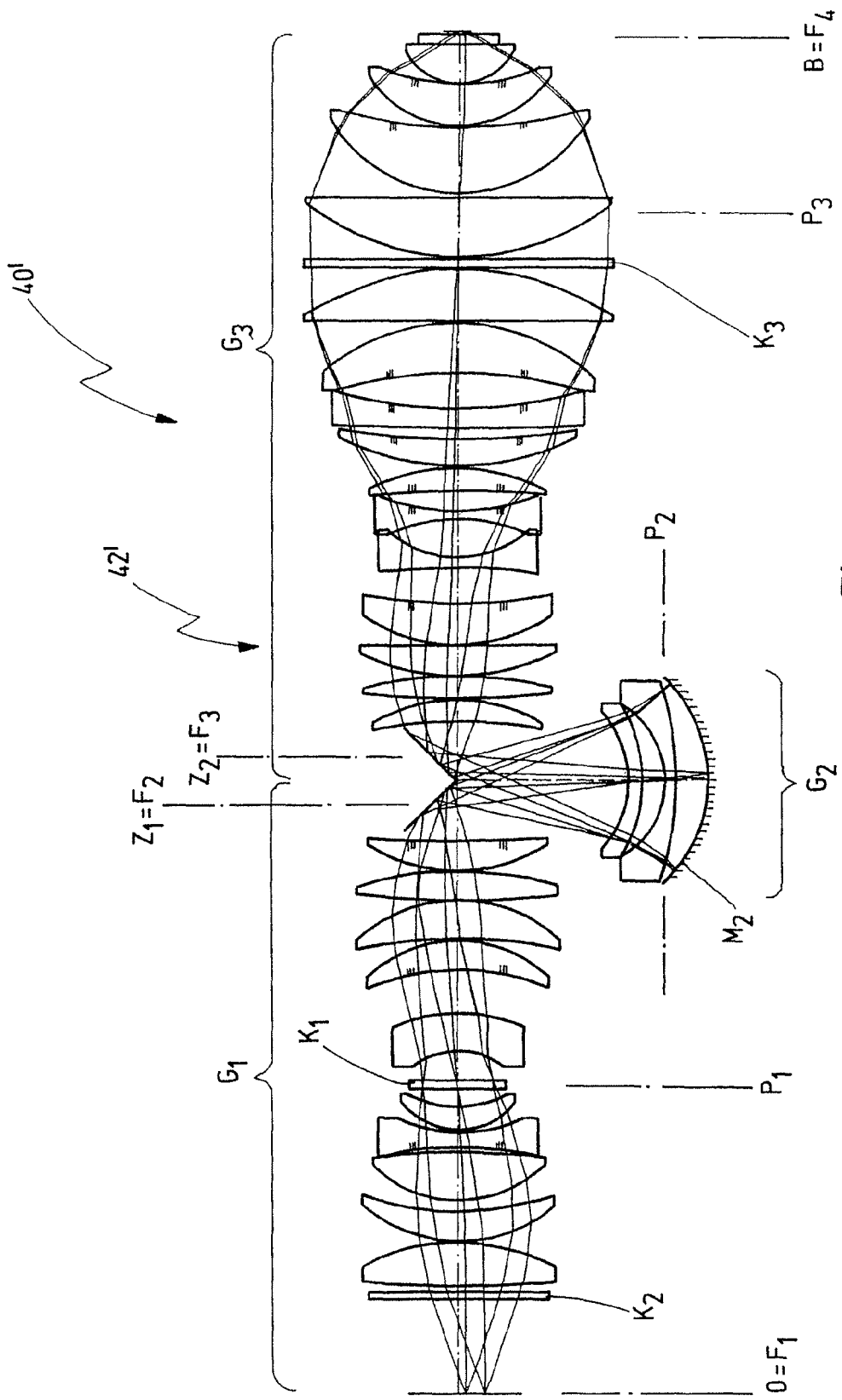
FIG. 7 shows a projection objective.

Finally, a yet further exemplary embodiment of a projection objective 40' having an optical arrangement 42' is illustrated in FIG. 7. The projection objective 40' shown in FIG. 7 is similar in its basic design to the exemplary embodiments in FIGS. 4 and 5, and so reference may be made to the description there.

As distinguished from the exemplary embodiments in FIGS. 4 and 5, the optical arrangement 42' has a total of three correction elements $K_1$, $K_2$ and $K_3$. The first correction element $K_1$ is located in the first pupil plane $P_1$, or is at least optically near thereto, and the second correction element $K_2$ is located between the object plane O and the pupil plane $P_1$ at a position which is not optically near either the object plane O or the pupil plane $P_1$.

The third correction element $K_3$ is located optically near the third pupil plane $P_3$.

The optical data of the projection objective 40' are summarized in Table 7. The basic design of the projection objective 40' without correction elements is described in WO 2006/121008 A1, to which supplementary reference is made and which is hereby incorporated by reference.

The following further measures are provided in the case of all previously described exemplary embodiments.

The first correction element $K_1$ and/or the second correction element $K_2$ and/or the third correction element $K_3$ can be exchanged during the operation of the projection objective 10, 20, 30, 40 or 50. "Exchangeable" in this sense means that the correction elements $K_1$ and/or $K_2$ and/or $K_3$ can be quickly removed from or quickly introduced into the light path, for example via a quick change mechanism. It is also possible to hold ready for the first correction element $K_1$ and/or the second correction element $K_2$ (and/or the third correction element $K_3$) a plurality of exchange correction elements which are then configured with other optical properties in order to be able to correct respectively detected aberrations most effectively.

As illustrated in FIGS. 1 to 7, the first correction element $K_1$ and/or the second correction element $K_2$ and/or the third correction element $K_3$ can be designed as plane plates. The correction elements $K_1$ and $K_2$ and/or $K_3$ therefore have no imaging optical action, but serve merely to correct aberrations. Moreover, because of the relatively small space they take up, plane plates can subsequently be inserted with particular advantage into an existing objective design with small changes to the objective design.

Depending on the corrective action to be achieved, the correction elements $K_1$ and/or $K_2$ and/or $K_3$ can be provided with an aspherization, and/or they can be designed as actively deformable elements which are assigned corresponding deformation manipulators, and/or they can also be provided with thermal manipulators which heat or cool the correction elements $K_1$ and/or $K_2$ and/or $K_3$, in order to set the desired optical corrective action in the correction elements $K_1$ and/or $K_2$ and/or $K_3$. Furthermore, the correction elements $K_1$ and/or $K_2$ and/or $K_3$ can be designed in a positionally adjustable fashion in order to achieve a specific optical corrective action, the correction elements $K_1$ and/or $K_2$ and/or $K_3$ being assigned appropriate manipulators for adjusting position. The positional adjustment can consist of displacements in the light propagation direction or transverse to the light propagation direction, or in superimpositions of these two directions, in rotations, tiltings etc.

The first correction element $K_1$, which is always arranged in the vicinity of a pupil plane, serves the purpose of correcting field-constant aberrations, while the correction element $K_2$, which is always arranged in an intermediate region between a field plane and a pupil plane, serves to correct aberrations which have at least field-dependent components, as well.

TABLE 1

NA: 1.2, Field: A = 26 mm, B = 5.5, R = 11.5 mm, WL 193.368

| SURFACE | RADII | | THICKNESSES | GLASSES | 193.368 nm | ½ DIAMETER |
|---|---|---|---|---|---|---|
| 0 | 0.0 | | 78.303613 | AIR | 1.00000000 | 68.000 |
| 1 | −394.191214 | | 41.739707 | SIO2 | 1.56078570 | 89.318 |
| 2 | −198.169616 | AS | 0.996922 | AIR | 1.00000000 | 97.224 |
| 3 | 446.404208 | | 56.197179 | SIO2 | 1.56078570 | 105.457 |
| 4 | −184.168849 | | 146.744728 | AIR | 1.00000000 | 105.917 |
| 5 | −160.246412 | AS | 14.998293 | CAF2 | 1.50185255 | 53.242 |
| 6 | −1617.196824 | | 15.111401 | AIR | 1.00000000 | 63.827 |
| 7 | −207.292891 | | −15.111401 | REFL | 1.00000000 | 67.705 |
| 8 | −1617.196824 | | −14.998293 | CAF2 | 1.50185255 | 67.674 |
| 9 | −160.246412 | AS | −131.745949 | AIR | 1.00000000 | 67.172 |
| 10 | −3715.402662 | AS | 176.854423 | REFL | 1.00000000 | 91.197 |
| 11 | −1112.237530 | | 60.308635 | SIO2 | 1.56078570 | 151.888 |
| 12 | −229.362794 | | 1.203111 | AIR | 1.00000000 | 155.623 |
| 13 | −3717.820612 | AS | 42.208898 | SIO2 | 1.56078570 | 163.490 |
| 14 | −347.352770 | | 3.017120 | AIR | 1.00000000 | 165.417 |
| 15 | 0.000000 | | 15.000000 | SIO2 | 1.56078570 | 165.592 |
| 16 | 0.000000 | | 3.026023 | AIR | 1.00000000 | 165.630 |
| 17 | 202.325441 | | 57.054809 | SIO2 | 1.56078570 | 165.979 |
| 18 | 364.549775 | AS | 112.911698 | AIR | 1.00000000 | 157.356 |
| 19 | 523.345363 | AS | 14.104445 | SIO2 | 1.56078570 | 136.685 |
| 20 | 273.861634 | | 81.489838 | AIR | 1.00000000 | 129.939 |
| 21 | 155.304364 | | 65.231336 | SIO2 | 1.56078570 | 105.552 |
| 22 | 127.633723 | | 54.935139 | AIR | 1.00000000 | 80.523 |
| 23 | −227.097829 | AS | 13.016244 | SIO2 | 1.56078570 | 78.928 |
| 24 | 182.536777 | | 46.455888 | AIR | 1.00000000 | 84.166 |
| 25 | −207.182814 | | 61.528057 | SIO2 | 1.56078570 | 87.897 |
| 26 | −176.528856 | | 0.993891 | AIR | 1.00000000 | 110.784 |
| 27 | 865.127053 | AS | 12.999101 | SIO2 | 1.56078570 | 130.528 |
| 28 | 415.920005 | | 19.152224 | AIR | 1.00000000 | 136.921 |
| 29 | 1097.434748 | | 63.443284 | SIO2 | 1.56078570 | 140.520 |
| 30 | −336.168712 | | 0.998659 | AIR | 1.00000000 | 147.380 |
| 31 | 2299.996269 | | 35.799374 | SIO2 | 1.56078570 | 157.767 |
| 32 | −716.010845 | | 29.177622 | AIR | 1.00000000 | 159.443 |
| 33 | 451.524671 | | 46.260303 | SIO2 | 1.56078570 | 166.030 |
| 34 | −3021.353828 | | −2.567508 | AIR | 1.00000000 | 165.137 |
| 35 | 0.000000 | | 0.000000 | AIR | 1.00000000 | 164.803 |
| 36 | 0.000000 | | 23.628165 | AIR | 1.00000000 | 164.803 |
| 37 | 0.000000 | | 15.000000 | SIO2 | 1.56078570 | 163.773 |
| 38 | 0.000000 | | 1.001035 | AIR | 1.00000000 | 163.354 |
| 39 | 422.935081 | | 60.555463 | SIO2 | 1.56078570 | 161.905 |
| 40 | −852.100717 | | 0.999943 | AIR | 1.00000000 | 159.604 |
| 41 | 189.766568 | | 49.041357 | SIO2 | 1.56078570 | 131.068 |
| 42 | 708.548829 | AS | 0.999918 | AIR | 1.00000000 | 125.218 |
| 43 | 126.232399 | | 30.801444 | SIO2 | 1.56078570 | 97.429 |
| 44 | 170.774778 | AS | 0.997967 | AIR | 1.00000000 | 87.907 |
| 45 | 115.264122 | | 28.743458 | CAF2 | 1.50185255 | 79.319 |
| 46 | 172.796848 | AS | 0.989848 | AIR | 1.00000000 | 66.334 |
| 47 | 95.876561 | | 47.472181 | SIO2 | 1.56078570 | 57.697 |
| 48 | 0.000000 | | 0.000000 | IMM | 1.43667693 | 23.674 |
| 49 | 0.000000 | | 3.000000 | SIO2 | 1.56078570 | 23.674 |
| 50 | 0.000000 | | 1.996512 | IMM | 1.43667693 | 20.051 |
| 51 | 0.000000 | | 0.000000 | AIR | 0.00000000 | 17.000 |

ASPHERIC CONSTANTS

| | SRF | | | | |
|---|---|---|---|---|---|
| | 2 | 5 | 9 | 10 | 13 |
| K | 0 | 0 | 0 | 0 | 0 |
| C1 | 1.392433e−09 | 1.801887e−08 | 1.801887e−08 | −1.280168e−09 | −1.440880e−10 |
| C2 | −2.808823e−13 | 7.546535e−13 | 7.546535e−13 | −4.640590e−17 | −4.234605e−13 |

TABLE 1-continued

NA: 1.2, Field: A = 26 mm, B = 5.5, R = 11.5 mm, WL 193.368

| | | | | | |
|---|---|---|---|---|---|
| C3 | −1.371628e−18 | 2.174176e−17 | 2.174176e−17 | −8.894827e−18 | 4.084291e−18 |
| C4 | 1.424663e−20 | 7.624607e−22 | 7.624607e−22 | 2.947352e−22 | 5.565576e−23 |
| C5 | 6.348497e−26 | −1.141362e−25 | −1.141362e−25 | −1.966904e−26 | −3.040396e−27 |
| C6 | 5.204122e−29 | 3.028426e−29 | 3.028426e−29 | −1.184645e−31 | 2.543798e−32 |
| C7 | 0.000000e+00 | 0.000000e+00 | 0.000000e+00 | 0.000000e+00 | 0.000000e+00 |
| C8 | 0.000000e+00 | 0.000000e+00 | 0.000000e+00 | 0.000000e+00 | 0.000000e+00 |
| C9 | 0.000000e+00 | 0.000000e+00 | 0.000000e+00 | 0.000000e+00 | 0.000000e+00 |

| | SRF | | | | |
|---|---|---|---|---|---|
| | 18 | 19 | 23 | 27 | 42 |
| K | 0 | 0 | 0 | 0 | 0 |
| C1 | 2.672810e−08 | 2.775005e−08 | −1.669000e−07 | −1.217647e−08 | 9.547564e−09 |
| C2 | −3.860076e−13 | −4.185969e−13 | −2.863948e−12 | 1.744126e−13 | 3.052025e−14 |
| C3 | −4.016442e−19 | 1.241612e−17 | 5.822813e−17 | −4.293560e−18 | −1.353704e−17 |
| C4 | 7.404508e−22 | 1.372267e−21 | −1.894875e−21 | 2.525946e−22 | 1.116101e−21 |
| C5 | −2.355249e−26 | −5.426320e−26 | −6.837523e−25 | −7.956605e−27 | −3.620235e−26 |
| C6 | 3.556112e−31 | 1.048616e−30 | 1.669138e−29 | 2.582110e−31 | 7.221257e−31 |
| C7 | 0.000000e+00 | 0.000000e+00 | 0.000000e+00 | 0.000000e+00 | 0.000000e+00 |
| C8 | 0.000000e+00 | 0.000000e+00 | 0.000000e+00 | 0.000000e+00 | 0.000000e+00 |
| C9 | 0.000000e+00 | 0.000000e+00 | 0.000000e+00 | 0.000000e+00 | 0.000000e+00 |

| | SRF | |
|---|---|---|
| | 44 | 46 |
| K | 0 | 0 |
| C1 | 7.852231e−10 | 8.538916e−08 |
| C2 | −7.474578e−14 | 3.992913e−12 |
| C3 | 1.525417e−16 | −7.180100e−16 |
| C4 | 8.737198e−21 | 3.099598e−22 |
| C5 | −1.853350e−25 | −9.334126e−24 |
| C6 | 2.659521e−29 | 1.130507e−27 |
| C7 | 0.000000e+00 | 0.000000e+00 |
| C8 | 0.000000e+00 | 0.000000e+00 |
| C9 | 0.000000e+00 | 0.000000e+00 |

TABLE 2

NA: 1.3, Field: A = 26 mm, B = 4, R = 14 mm, WL 193.368 nm

| SURFACE | RADII | THICKNESSES | GLASSES | INDEX | ½ DIAMETER |
|---|---|---|---|---|---|
| 0 | 0.0 | 57.601464 | AIR | 1.00000000 | 72.000 |
| 1 | −119.598919 AS | 40.752708 | SIO2 | 1.56078570 | 82.269 |
| 2 | −210.232462 | 2.023855 | AIR | 1.00000000 | 101.057 |
| 3 | 215.685827 | 66.865592 | SIO2 | 1.56078570 | 128.153 |
| 4 | −579.527028 | 0.998419 | AIR | 1.00000000 | 127.473 |
| 5 | 0.000000 | 15.000000 | SIO2 | 1.56078570 | 123.835 |
| 6 | 0.000000 | 2.075403 | AIR | 1.00000000 | 121.571 |
| 7 | 1216.286957 | 18.228954 | SIO2 | 1.56078570 | 119.661 |
| 8 | −869.049699 AS | 210.065231 | AIR | 1.00000000 | 117.523 |
| 9 | −154.503018 | 12.995617 | SIO2 | 1.56078570 | 80.708 |
| 10 | −558.821838 | 16.017211 | AIR | 1.00000000 | 85.674 |
| 11 | −235.158769 AS | −16.017211 | REFL | 1.00000000 | 87.766 |
| 12 | −558.821838 | −12.995617 | SIO2 | 1.56078570 | 85.404 |
| 13 | −154.503018 | −190.064030 | AIR | 1.00000000 | 76.527 |
| 14 | −830.589177 AS | 486.673979 | REFL | 1.00000000 | 98.568 |
| 15 | −410.985202 | −193.020300 | REFL | 1.00000000 | 273.647 |
| 16 | −437.290174 | 113.125152 | REFL | 1.00000000 | 135.926 |
| 17 | 267.646367 AS | 12.998513 | SIO2 | 1.56078570 | 95.142 |
| 18 | 109.319044 | 71.810108 | AIR | 1.00000000 | 84.288 |
| 19 | −155.678245 | 24.706124 | SIO2 | 1.56078570 | 85.404 |
| 20 | −543.272055 | 4.335390 | AIR | 1.00000000 | 99.062 |
| 21 | 24445.217145 | 13.950217 | SIO2 | 1.56078570 | 104.821 |
| 22 | 196.548934 AS | 32.737178 | AIR | 1.00000000 | 116.137 |
| 23 | −1380.847087 AS | 47.097422 | SIO2 | 1.56078570 | 124.268 |
| 24 | −312.879094 AS | 12.293161 | AIR | 1.00000000 | 129.120 |
| 25 | 270.274855 | 55.849255 | SIO2 | 1.56078570 | 162.524 |
| 26 | −38956.530667 AS | 29.047600 | AIR | 1.00000000 | 161.278 |
| 27 | 309.940005 AS | 62.710725 | SIO2 | 1.56078570 | 161.189 |
| 28 | −465.378574 | 12.984279 | AIR | 1.00000000 | 161.962 |
| 29 | −423.245186 | 17.988269 | SIO2 | 1.56078570 | 160.698 |
| 30 | −775.040675 | 12.095938 | AIR | 1.00000000 | 162.998 |

TABLE 2-continued

NA: 1.3, Field: A = 26 mm, B = 4, R = 14 mm, WL 193.368 nm

| | | | | | |
|---|---|---|---|---|---|
| 31 | 0.000000 | 15.000000 | SIO2 | 1.56078570 | 162.730 |
| 32 | 0.000000 | 26.456480 | AIR | 1.00000000 | 162.643 |
| 33 | 0.000000 | 0.000000 | AIR | 1.00000000 | 162.629 |
| 34 | 0.000000 | −24.103637 | AIR | 1.00000000 | 162.629 |
| 35 | 469.264272 | 28.933015 | SIO2 | 1.56078570 | 163.056 |
| 36 | 1247.953833 | 1.106804 | AIR | 1.00000000 | 162.501 |
| 37 | 330.026166 | 57.681933 | SIO2 | 1.56078570 | 162.159 |
| 38 | −3249.855106 AS | 0.998349 | AIR | 1.00000000 | 160.138 |
| 39 | 154.864461 | 61.102740 | SIO2 | 1.56078570 | 128.336 |
| 40 | 498.034349 AS | 0.993535 | AIR | 1.00000000 | 121.162 |
| 41 | 100.640590 | 44.902715 | SIO2 | 1.56078570 | 87.015 |
| 42 | 256.488347 AS | 0.971666 | AIR | 1.00000000 | 74.934 |
| 43 | 84.324806 | 47.078122 | SIO2 | 1.56078570 | 57.364 |
| 44 | 0.000000 | 1.000000 | WATER | 1.43667693 | 20.148 |
| 45 | 0.000000 | 0.000000 | AIR | 0.00000000 | 18.001 |

ASPHERIC CONSTANTS

| | SRF | | | | |
|---|---|---|---|---|---|
| | 1 | 8 | 11 | 14 | 17 |
| K | 0 | 0 | 0 | 0 | 0 |
| C1 | 8.239862e−08 | 3.538306e−08 | −3.277327e−09 | −2.744235e−09 | −2.398764e−08 |
| C2 | 2.337982e−12 | −4.151996e−13 | −1.091434e−13 | 1.866716e−13 | 1.254301e−12 |
| C3 | 3.678382e−16 | 5.769308e−17 | −1.991536e−18 | −5.960771e−18 | 2.037512e−16 |
| C4 | −2.223105e−20 | −2.411453e−21 | 2.984786e−24 | 3.073631e−22 | −4.065121e−20 |
| C5 | 3.007844e−24 | 6.269400e−26 | −6.132545e−27 | −1.291587e−26 | 3.021671e−24 |
| C6 | −6.701338e−29 | 4.859807e−31 | −3.611404e−32 | 2.791406e−31 | −8.808337e−29 |
| C7 | 0.000000e+00 | 0.000000e+00 | 0.000000e+00 | 0.000000e+00 | 0.000000e+00 |
| C8 | 0.000000e+00 | 0.000000e+00 | 0.000000e+00 | 0.000000e+00 | 0.000000e+00 |
| C9 | 0.000000e+00 | 0.000000e+00 | 0.000000e+00 | 0.000000e+00 | 0.000000e+00 |

| | SRF | | | | |
|---|---|---|---|---|---|
| | 22 | 23 | 24 | 26 | 27 |
| K | 0 | 0 | 0 | 0 | 0 |
| C1 | −2.584292e−08 | 5.067971e−08 | −1.189020e−08 | 2.911874e−08 | −2.946438e−08 |
| C2 | −7.177953e−13 | 4.809462e−13 | 5.053313e−13 | −4.562463e−13 | 4.758206e−13 |
| C3 | −1.126960e−16 | −8.588772e−17 | −2.469630e−17 | 7.920650e−18 | −1.104714e−17 |
| C4 | 1.096561e−20 | 1.523536e−23 | −7.975852e−23 | −2.806318e−22 | 7.483230e−23 |
| C5 | −4.053220e−25 | 1.203472e−25 | −1.085094e−26 | 5.644206e−27 | −2.311461e−27 |
| C6 | 4.947334e−30 | −1.922187e−30 | −8.830951e−31 | −7.020347e−32 | −4.536924e−32 |
| C7 | 0.000000e+00 | 0.000000e+00 | 0.000000e+00 | 0.000000e+00 | 0.000000e+00 |
| C8 | 0.000000e+00 | 0.000000e+00 | 0.000000e+00 | 0.000000e+00 | 0.000000e+00 |
| C9 | 0.000000e+00 | 0.000000e+00 | 0.000000e+00 | 0.000000e+00 | 0.000000e+00 |

| | SRF | | |
|---|---|---|---|
| | 38 | 40 | 42 |
| K | 0 | 0 | 0 |
| C1 | 1.303063e−08 | −1.311818e−11 | 8.781384e−08 |
| C2 | −8.717504e−13 | 1.825033e−12 | 9.514823e−12 |
| C3 | 1.035440e−17 | −2.385113e−16 | −6.587823e−16 |
| C4 | 9.879529e−23 | 1.880562e−20 | 4.013727e−20 |
| C5 | −2.114495e−27 | −7.119989e−25 | 1.218883e−24 |
| C6 | 1.566842e−33 | 1.177690e−29 | −6.344699e−28 |
| C7 | 0.000000e+00 | 0.000000e+00 | 0.000000e+00 |
| C8 | 0.000000e+00 | 0.000000e+00 | 0.000000e+00 |
| C9 | 0.000000e+00 | 0.000000e+00 | 0.000000e+00 |

TABLE 3

NA: 1.35; Field: 26 mm × 5.5 mm; WL 193.368 nm

| SURFACE | RADII | THICKNESSES | GLASSES | 193.368 nm | ½ DIAMETER |
|---|---|---|---|---|---|
| 0 | 0.000000 | 30.000000 | | 1.00000000 | 63.500 |
| 1 | 155.500468 | 47.980384 | SIO2 | 1.56018811 | 82.822 |
| 2 | −333.324258 AS | 1.000851 | | 1.00000000 | 82.263 |
| 3 | 240.650949 | 10.194017 | SIO2 | 1.56018811 | 79.900 |
| 4 | 106.801800 | 20.365766 | | 1.00000000 | 74.667 |
| 5 | 124.630972 | 34.680113 | SIO2 | 1.56018811 | 79.588 |

TABLE 3-continued

NA: 1.35; Field: 26 mm × 5.5 mm; WL 193.368 nm

| | | | | | |
|---|---|---|---|---|---|
| 6 | 468.398192 | 11.981603 | | 1.00000000 | 77.781 |
| 7 | 380.553803 AS | 26.909838 | SIO2 | 1.56018811 | 77.238 |
| 8 | −171.820449 | 19.336973 | | 1.00000000 | 77.050 |
| 9 | −3157.552773 | 18.733166 | SIO2 | 1.56018811 | 63.691 |
| 10 | −201.010840 AS | 2.828885 | | 1.00000000 | 61.535 |
| 11 | 0.000000 | 10.000000 | SIO2 | 1.56018811 | 54.631 |
| 12 | 0.000000 | 14.057031 | | 1.00000000 | 51.301 |
| 13 | −675.142412 | 17.151908 | SIO2 | 1.56018811 | 45.967 |
| 14 | −177.431040 | 17.484199 | | 1.00000000 | 49.621 |
| 15 | 0.000000 | 10.000000 | SIO2 | 1.56018811 | 57.648 |
| 16 | 0.000000 | 48.376949 | | 1.00000000 | 59.680 |
| 17 | −339.503853 | 22.085648 | SIO2 | 1.56018811 | 72.901 |
| 18 | −153.734447 | 9.426343 | | 1.00000000 | 75.785 |
| 19 | −133.551892 | 10.000178 | SIO2 | 1.56018811 | 76.547 |
| 20 | −159.012061 | 260.928174 | | 1.00000000 | 80.555 |
| 21 | −186.269426 AS | −223.122910 | REFL | 1.00000000 | 159.966 |
| 22 | 171.856468 AS | 290.241437 | REFL | 1.00000000 | 137.560 |
| 23 | 418.208640 | 33.119326 | SIO2 | 1.56018811 | 109.835 |
| 24 | −764.923828 | 24.991712 | | 1.00000000 | 109.215 |
| 25 | −933.573206 | 23.101710 | SIO2 | 1.56018811 | 104.458 |
| 26 | 1486.991752 AS | 3.727360 | | 1.00000000 | 103.086 |
| 27 | 264.108066 | 15.536565 | SIO2 | 1.56018811 | 94.140 |
| 28 | 124.187755 | 40.232391 | | 1.00000000 | 84.090 |
| 29 | −905.198558 AS | 11.197639 | SIO2 | 1.56018811 | 83.893 |
| 30 | 131.424652 | 22.232119 | | 1.00000000 | 82.631 |
| 31 | 288.907138 AS | 18.371287 | SIO2 | 1.56018811 | 85.149 |
| 32 | 1443.815086 | 26.039370 | | 1.00000000 | 87.978 |
| 33 | −219.723661 | 10.212957 | SIO2 | 1.56018811 | 90.084 |
| 34 | −505.370348 AS | 1.495833 | | 1.00000000 | 104.533 |
| 35 | 602.513212 AS | 45.614756 | SIO2 | 1.56018811 | 113.361 |
| 36 | −381.370078 | 0.999817 | | 1.00000000 | 124.374 |
| 37 | −3646.793540 AS | 62.876806 | SIO2 | 1.56018811 | 133.446 |
| 38 | −186.442382 | 0.999658 | | 1.00000000 | 138.789 |
| 39 | 803.321916 AS | 47.355581 | SIO2 | 1.56018811 | 156.646 |
| 40 | −403.820101 | 0.999375 | | 1.00000000 | 158.048 |
| 41 | 464.394742 | 43.310049 | SIO2 | 1.56018811 | 156.920 |
| 42 | −28298.847889 AS | 5.923544 | | 1.00000000 | 155.749 |
| 43 | 0.000000 | −4.924437 | | 1.00000000 | 153.985 |
| 44 | 452.887984 | 57.784133 | SIO2 | 1.56018811 | 151.449 |
| 45 | −566.954376 AS | 1.000000 | | 1.00000000 | 149.326 |
| 46 | 114.038890 | 60.833075 | SIO2 | 1.56018811 | 99.518 |
| 47 | 1045.400093 AS | 1.000000 | | 1.00000000 | 90.060 |
| 48 | 61.105427 | 43.354396 | SIO2 | 1.56018811 | 51.240 |
| 49 | 0.000000 | 3.100000 | H2O | 1.43618227 | 24.415 |
| 50 | 0.000000 | 0.000000 | H2O | 1.43618227 | 15.875 |

ASPHERIC CONSTANTS

| | SURFACE | | | | |
|---|---|---|---|---|---|
| | 2 | 7 | 10 | 21 | 22 |
| K | 0 | 0 | 0 | −2.1798 | −0.6806 |
| C1 | 6.256157E−08 | −3.919709E−07 | −1.057407E−07 | −3.488371E−08 | 7.086654E−09 |
| C2 | 3.982916E−12 | 2.095591E−11 | 4.580617E−11 | 2.874848E−13 | 1.057963E−13 |
| C3 | −9.451716E−16 | 9.822817E−16 | −9.115065E−15 | 1.491672E−18 | 1.491672E−18 |
| C4 | 1.335061E−19 | −1.667379E−20 | 3.329325E−18 | 1.681271E−22 | 1.625713E−23 |
| C5 | −1.301313E−23 | −4.323686E−23 | −7.843408E−22 | −3.708622E−27 | 4.834151E−28 |
| C6 | 8.344361E−28 | 5.150093E−27 | 1.064851E−25 | 4.914613E−32 | −3.211541E−33 |
| C7 | −2.584534E−32 | −2.098245E−31 | −6.440967E−30 | −4.062945E−37 | 1.425318E−37 |
| C8 | 0.000000E+00 | 0.000000E+00 | 0.000000E+00 | 0.000000E+00 | 0.000000E+00 |
| C9 | 0.000000E+00 | 0.000000E+00 | 0.000000E+00 | 0.000000E+00 | 0.000000E+00 |

| | SURFACE | | | | |
|---|---|---|---|---|---|
| | 26 | 29 | 31 | 34 | 35 |
| K | 0 | 0 | 0 | 0 | 0 |
| C1 | −2.253603E−07 | 2.933385E−08 | 4.633569E−09 | 1.036685E−07 | −4.703595E−08 |
| C2 | 1.351029E−11 | 3.990857E−13 | −4.997364E−12 | 2.758011E−12 | 4.159400E−12 |
| C3 | 3.795789E−17 | −6.050500E−17 | 4.889637E−16 | −3.278071E−16 | −3.908920E−16 |
| C4 | −7.421214E−20 | 1.255229E−19 | −1.484469E−19 | −2.153010E−20 | 1.644386E−20 |
| C5 | 6.117939E−24 | −1.877429E−23 | 1.977553E−23 | 1.089767E−24 | −1.808670E−25 |
| C6 | −2.347293E−28 | 1.072691E−27 | −1.918985E−27 | 6.735329E−29 | −1.857865E−29 |
| C7 | 3.434091E−33 | −3.218306E−32 | 8.501230E−32 | −2.252218E−33 | 6.594092E−34 |
| C8 | 0.000000E+00 | 0.000000E+00 | 0.000000E+00 | 0.000000E+00 | 0.000000E+00 |
| C9 | 0.000000E+00 | 0.000000E+00 | 0.000000E+00 | 0.000000E+00 | 0.000000E+00 |

TABLE 3-continued

NA: 1.35; Field: 26 mm × 5.5 mm; WL 193.368 nm

| | SURFACE | |
|---|---|---|
| | 37 | 39 |
| K | 0 | 0 |
| C1 | −1.945342E−10 | −5.117066E−08 |
| C2 | −3.072667E−12 | 1.601404E−12 |
| C3 | 1.392672E−16 | 1.103417E−17 |
| C4 | −1.594346E−21 | −7.047636E−22 |
| C5 | −5.987158E−26 | −3.288333E−26 |
| C6 | 2.240055E−30 | 1.485188E−30 |
| C7 | 0.000000E+00 | −1.523531E−35 |
| C8 | 0.000000E+00 | 0.000000E+00 |
| C9 | 0.000000E+00 | 0.000000E+00 |

TABLE 4

NA: 1.25; Field: 26 mm × 5.5 mm; WL: 193.3 nm

| SURFACE | RADII | | THICKNESSES | GLASSES | 193.3 nm | ½ DIAMETER |
|---|---|---|---|---|---|---|
| 0 | 0.000000 | | 81.909100 | | 1.00000000 | 60.033 |
| 1 | 2048.443266 | | 21.250400 | SIO2 | 1.56032610 | 84.944 |
| 2 | −397.145026 | | 0.999674 | | 1.00000000 | 86.678 |
| 3 | 0.000000 | | 9.999836 | SIO2 | 1.56032610 | 88.251 |
| 4 | 0.000000 | | 0.999631 | | 1.00000000 | 89.202 |
| 5 | 148.901602 | | 50.000000 | SIO2 | 1.56032610 | 94.513 |
| 6 | 357.459757 | | 52.494455 | | 1.00000000 | 89.210 |
| 7 | 183.941368 | | 34.086800 | SIO2 | 1.56032610 | 80.169 |
| 8 | −464.124393 | AS | 3.490723 | | 1.00000000 | 76.925 |
| 9 | 91.427855 | | 50.000000 | SIO2 | 1.56032610 | 63.072 |
| 10 | 93.895791 | | 11.512540 | | 1.00000000 | 42.632 |
| 11 | 0.000000 | | 9.998981 | SIO2 | 1.56032610 | 41.869 |
| 12 | 0.000000 | | 9.386987 | | 1.00000000 | 38.436 |
| 13 | −94.982271 | | 50.000000 | SIO2 | 1.56032610 | 38.838 |
| 14 | −86.138668 | | 8.374122 | | 1.00000000 | 54.696 |
| 15 | −74.540104 | | 38.657300 | SIO2 | 1.56032610 | 55.419 |
| 16 | −382.564885 | | 13.037213 | | 1.00000000 | 82.587 |
| 17 | −382.167395 | | 50.066100 | SIO2 | 1.56032610 | 90.480 |
| 18 | −117.361983 | | 4.455250 | | 1.00000000 | 96.112 |
| 19 | −408.042301 | AS | 43.871600 | SIO2 | 1.56032610 | 102.130 |
| 20 | −177.569466 | | 9.816927 | | 1.00000000 | 106.603 |
| 21 | 289.476867 | | 27.848300 | SIO2 | 1.56032610 | 100.728 |
| 22 | 6501.491211 | | 0.998760 | | 1.00000000 | 98.745 |
| 23 | 224.530994 | | 27.157000 | SIO2 | 1.56032610 | 92.812 |
| 24 | 2986.561502 | AS | 75.000000 | | 1.00000000 | 89.569 |
| 25 | 0.000000 | | −226.222510 | REFL | 1.00000000 | 89.510 |
| 26 | 106.828577 | AS | −12.500000 | SIO2 | 1.56032610 | 77.673 |
| 27 | 1042.751231 | | −49.965582 | | 1.00000000 | 94.062 |
| 28 | 111.149211 | | −12.500000 | SIO2 | 1.56032610 | 94.838 |
| 29 | 212.774328 | | −26.106409 | | 1.00000000 | 122.137 |
| 30 | 155.022997 | | 26.106409 | REFL | 1.00000000 | 124.612 |
| 31 | 212.774328 | | 12.500000 | SIO2 | 1.56032610 | 122.115 |
| 32 | 111.149211 | | 49.965582 | | 1.00000000 | 94.710 |
| 33 | 1042.751231 | | 12.500000 | SIO2 | 1.56032610 | 93.963 |
| 34 | 106.828577 | AS | 226.222510 | | 1.00000000 | 78.916 |
| 35 | 0.000000 | | −74.219082 | REFL | 1.00000000 | 77.641 |
| 36 | 2294.592536 | | −22.331200 | SIO2 | 1.56032610 | 79.528 |
| 37 | 256.141486 | | −0.999710 | | 1.00000000 | 82.627 |
| 38 | −467.135025 | | −24.545000 | SIO2 | 1.56032610 | 89.496 |
| 39 | 691.583098 | | −0.999310 | | 1.00000000 | 90.566 |
| 40 | −233.607789 | | −45.979800 | SIO2 | 1.56032610 | 93.086 |
| 41 | −4942.551686 | | −4.660965 | | 1.00000000 | 90.501 |
| 42 | −145.114796 | | −50.000000 | SIO2 | 1.56032610 | 86.173 |
| 43 | −503.288735 | AS | −13.136267 | | 1.00000000 | 76.698 |
| 44 | 763.625290 | | −12.500000 | SIO2 | 1.56032610 | 75.648 |
| 45 | −95.483381 | AS | −39.092954 | | 1.00000000 | 66.704 |
| 46 | −6058.472160 | | −12.500000 | SIO2 | 1.56032610 | 69.545 |
| 47 | −149.880323 | AS | −15.887220 | | 1.00000000 | 73.780 |
| 48 | −503.080539 | | −30.687700 | SIO2 | 1.56032610 | 76.357 |
| 49 | 1171.552640 | | −77.445168 | | 1.00000000 | 83.009 |
| 50 | −3285.578928 | AS | −22.658500 | SIO2 | 1.56032610 | 120.317 |
| 51 | 596.398897 | | −0.998775 | | 1.00000000 | 123.080 |
| 52 | −357.977963 | | −33.153400 | SIO2 | 1.56032610 | 136.416 |
| 53 | −3248.236982 | | −1.812371 | | 1.00000000 | 136.760 |

TABLE 4-continued

NA: 1.25; Field: 26 mm × 5.5 mm; WL: 193.3 nm

| | | | | | |
|---|---|---|---|---|---|
| 54 | −308.579307 | −49.249300 | SIO2 | 1.56032610 | 139.626 |
| 55 | 836.621146 AS | −11.829470 | | 1.00000000 | 138.580 |
| 56 | 0.000000 | 2.947366 | | 1.00000000 | 134.942 |
| 57 | −784.542969 | −35.882400 | SIO2 | 1.56032610 | 134.087 |
| 58 | 1336.948853 | −3.431255 | | 1.00000000 | 131.711 |
| 59 | −322.438168 | −35.943900 | SIO2 | 1.56032610 | 123.107 |
| 60 | 3281.822778 | −2.392713 | | 1.00000000 | 120.250 |
| 61 | −131.283783 | −28.495000 | SIO2 | 1.56032610 | 95.317 |
| 62 | −199.868775 AS | −1.086856 | | 1.00000000 | 88.629 |
| 63 | −96.539151 | −34.303600 | SIO2 | 1.56032610 | 76.133 |
| 64 | −225.944484 AS | −1.323326 | | 1.00000000 | 66.927 |
| 65 | −61.472761 | −50.000000 | SIO2 | 1.56032610 | 49.298 |
| 66 | 0.000000 | −1.000000 | H2O | 1.43681630 | 16.573 |
| 67 | 0.000000 | 0.001593 | H2O | 1.43681630 | 15.013 |

ASPHERIC CONSTANTS

SURFACE

| | 8 | 19 | 24 | 26 | 34 |
|---|---|---|---|---|---|
| K | 0 | 0 | 0 | 0 | 0 |
| C1 | 7.931903E−08 | −1.177647E−08 | 1.310659E−08 | −8.713192E−08 | −8.713192E−08 |
| C2 | 3.361972E−13 | 4.916744E−13 | 2.349673E−13 | −3.312749E−12 | −3.312749E−12 |
| C3 | 2.733335E−16 | −1.906952E−17 | −1.627068E−17 | −1.959490E−16 | −1.959490E−16 |
| C4 | −2.918068E−20 | 3.642462E−23 | 2.940777E−22 | −1.644695E−20 | −1.644695E−20 |
| C5 | 1.460982E−24 | 5.759228E−27 | 1.581363E−26 | 1.961941E−25 | 1.961941E−25 |
| C6 | −1.007942E−29 | −5.176777E−32 | −8.636738E−31 | −1.613799E−28 | −1.613799E−28 |
| C7 | 0.000000E+00 | 0.000000E+00 | 0.000000E+00 | 0.000000E+00 | 0.000000E+00 |
| C8 | 0.000000E+00 | 0.000000E+00 | 0.000000E+00 | 0.000000E+00 | 0.000000E+00 |
| C9 | 0.000000E+00 | 0.000000E+00 | 0.000000E+00 | 0.000000E+00 | 0.000000E+00 |

SURFACE

| | 43 | 45 | 47 | 50 | 55 |
|---|---|---|---|---|---|
| K | 0 | 0 | 0 | 0 | 0 |
| C1 | −3.218290E−08 | −1.408460E−08 | 3.765640E−08 | 1.544290E−08 | −9.784690E−09 |
| C2 | 4.089760E−13 | 3.732350E−12 | 2.045650E−12 | −1.526310E−13 | 2.155450E−14 |
| C3 | 9.461900E−17 | 5.781700E−17 | 6.726610E−17 | −1.172350E−17 | −2.664880E−17 |
| C4 | −1.126860E−20 | 4.020440E−20 | 3.357790E−21 | −3.026260E−22 | 1.199020E−21 |
| C5 | 1.093490E−24 | 1.811160E−24 | −5.515760E−25 | −2.050700E−28 | −2.503210E−26 |
| C6 | −2.303040E−29 | −3.465020E−28 | 2.958290E−28 | 3.614870E−31 | 2.100160E−31 |
| C7 | 0.000000E+00 | 0.000000E+00 | 0.000000E+00 | 0.000000E+00 | 0.000000E+00 |
| C8 | 0.000000E+00 | 0.000000E+00 | 0.000000E+00 | 0.000000E+00 | 0.000000E+00 |
| C9 | 0.000000E+00 | 0.000000E+00 | 0.000000E+00 | 0.000000E+00 | 0.000000E+00 |

SURFACE

| | 62 | 64 |
|---|---|---|
| K | 0 | 0 |
| C1 | 2.762150E−09 | −1.082280E−07 |
| C2 | −4.067930E−12 | −9.511940E−12 |
| C3 | 4.513890E−16 | 1.146050E−15 |
| C4 | −5.070740E−20 | −1.274000E−19 |
| C5 | 1.839760E−24 | 1.594380E−23 |
| C6 | −6.225130E−29 | −5.731730E−28 |
| C7 | 0.000000E+00 | 0.000000E+00 |
| C8 | 0.000000E+00 | 0.000000E+00 |
| C9 | 0.000000E+00 | 0.000000E+00 |

TABLE 5

NA: 1.25; Field: 26 mm × 4.9 mm; WL: 193.3 nm

| SURFACE | RADII | THICKNESSES | GLASSES | 193.3 nm | ½ DIAMETER |
|---|---|---|---|---|---|
| 0 | 0.000000 | 81.909100 | | 1.00000000 | 60.033 |
| 1 | 673.366211 | 21.250400 | SIO2 | 1.56032610 | 86.143 |
| 2 | −352.382699 | 1.000526 | | 1.00000000 | 86.826 |
| 3 | 0.000000 | 9.999922 | SIO2 | 1.56032610 | 87.758 |
| 4 | 0.000000 | 0.999828 | | 1.00000000 | 88.266 |
| 5 | 146.180992 | 50.000000 | SIO2 | 1.56032610 | 90.960 |
| 6 | 235.663997 | 47.614073 | | 1.00000000 | 83.553 |

TABLE 5-continued

NA: 1.25; Field: 26 mm × 4.9 mm; WL: 193.3 nm

| | | | | | |
|---|---|---|---|---|---|
| 7 | 232.803962 | 34.086800 | SIO2 | 1.56032610 | 77.655 |
| 8 | −525.462527 AS | 3.247857 | | 1.00000000 | 74.135 |
| 9 | 92.851551 | 50.000000 | SIO2 | 1.56032610 | 62.809 |
| 10 | 101.676358 | 27.396923 | | 1.00000000 | 43.995 |
| 11 | −98.402976 | 50.000000 | SIO2 | 1.56032610 | 40.939 |
| 12 | −87.452301 | 10.624080 | | 1.00000000 | 57.044 |
| 13 | −84.711067 | 38.657300 | SIO2 | 1.56032610 | 58.874 |
| 14 | −263.404585 | 18.850328 | | 1.00000000 | 81.979 |
| 15 | −324.827786 | 50.066100 | SIO2 | 1.56032610 | 92.383 |
| 16 | −134.730834 | 1.001012 | | 1.00000000 | 100.760 |
| 17 | −387.701255 AS | 43.871600 | SIO2 | 1.56032610 | 105.897 |
| 18 | −169.182822 | 1.411725 | | 1.00000000 | 110.197 |
| 19 | 286.958322 | 27.848300 | SIO2 | 1.56032610 | 103.540 |
| 20 | 2339.112166 | 1.040338 | | 1.00000000 | 101.350 |
| 21 | 215.327689 | 27.157000 | SIO2 | 1.56032610 | 95.069 |
| 22 | 2556.542175 AS | 72.132498 | | 1.00000000 | 92.199 |
| 23 | 0.000000 | −222.554121 | REFL | 1.00000000 | 98.569 |
| 24 | 106.814945 AS | −12.500000 | SIO2 | 1.56032610 | 78.634 |
| 25 | 967.943813 | −49.007290 | | 1.00000000 | 95.483 |
| 26 | 114.522293 | −12.500000 | SIO2 | 1.56032610 | 96.351 |
| 27 | 209.321713 | −24.703185 | | 1.00000000 | 122.199 |
| 28 | 155.317015 | 24.703185 | REFL | 1.00000000 | 124.370 |
| 29 | 209.321713 | 12.500000 | SIO2 | 1.56032610 | 121.966 |
| 30 | 114.522293 | 49.007290 | | 1.00000000 | 95.525 |
| 31 | 967.943813 | 12.500000 | SIO2 | 1.56032610 | 93.838 |
| 32 | 106.814945 AS | 222.554121 | | 1.00000000 | 78.764 |
| 33 | 0.000000 | −61.000000 | REFL | 1.00000000 | 74.683 |
| 34 | 1428.935254 | −22.331200 | SIO2 | 1.56032610 | 73.779 |
| 35 | 228.264696 | −1.001301 | | 1.00000000 | 77.285 |
| 36 | −462.657333 | −24.545000 | SIO2 | 1.56032610 | 84.167 |
| 37 | 885.483366 | −1.000977 | | 1.00000000 | 85.694 |
| 38 | −231.030433 | −45.979800 | SIO2 | 1.56032610 | 88.807 |
| 39 | 5456.439341 | −1.000168 | | 1.00000000 | 87.032 |
| 40 | −141.980854 | −50.000000 | SIO2 | 1.56032610 | 83.909 |
| 41 | −487.877853 AS | −11.892025 | | 1.00000000 | 74.753 |
| 42 | 744.304505 | −12.500000 | SIO2 | 1.56032610 | 74.160 |
| 43 | −95.471841 AS | −30.584840 | | 1.00000000 | 66.061 |
| 44 | 17792.738608 | −12.500000 | SIO2 | 1.56032610 | 67.093 |
| 45 | −154.563738 AS | −17.287404 | | 1.00000000 | 71.817 |
| 46 | −452.042111 | −30.687700 | SIO2 | 1.56032610 | 77.085 |
| 47 | 669.871673 | −100.369522 | | 1.00000000 | 82.829 |
| 48 | 3548.735563 AS | −22.658500 | SIO2 | 1.56032610 | 125.594 |
| 49 | 472.295389 | −4.772413 | | 1.00000000 | 128.352 |
| 50 | −366.259271 | −33.153400 | SIO2 | 1.56032610 | 144.068 |
| 51 | −12361.700432 | −9.333978 | | 1.00000000 | 144.157 |
| 52 | −317.083167 | −49.249300 | SIO2 | 1.56032610 | 146.304 |
| 53 | 962.293169 AS | −0.700250 | | 1.00000000 | 144.982 |
| 54 | 0.000000 | −4.992187 | | 1.00000000 | 143.559 |
| 55 | 0.000000 | −9.997236 | SIO2 | 1.56032610 | 143.164 |
| 56 | 0.000000 | −0.992199 | | 1.00000000 | 142.040 |
| 57 | −657.958896 | −35.882400 | SIO2 | 1.56032610 | 139.908 |
| 58 | 1515.969802 | −0.992804 | | 1.00000000 | 137.743 |
| 59 | −260.738714 | −35.943900 | SIO2 | 1.56032610 | 126.043 |
| 60 | −5237.030792 | −0.993752 | | 1.00000000 | 124.160 |
| 61 | −119.057555 | −28.495000 | SIO2 | 1.56032610 | 94.444 |
| 62 | −163.229803 AS | −0.992865 | | 1.00000000 | 87.366 |
| 63 | −102.409442 | −34.303600 | SIO2 | 1.56032610 | 77.909 |
| 64 | −186.405022 AS | −0.987636 | | 1.00000000 | 65.364 |
| 65 | −66.199250 | −50.000000 | SIO2 | 1.56032610 | 50.686 |
| 66 | 0.000000 | −1.000000 | H2OV | 1.43681630 | 16.566 |
| 67 | 0.000000 | 0.001593 | H2OV | 1.43681630 | 15.013 |

ASPHERIC CONSTANTS

| | SURFACE | | | | |
|---|---|---|---|---|---|
| | 8 | 17 | 22 | 24 | 32 |
| K | 0 | 0 | 0 | 0 | 0 |
| C1 | 5.233631E−08 | −1.143718E−08 | 1.521494E−08 | −8.173584E−08 | −8.173584E−08 |
| C2 | −4.247769E−13 | 4.539000E−13 | 2.236265E−13 | −3.442666E−12 | −3.442666E−12 |
| C3 | 2.264621E−16 | −2.603436E−17 | −2.309696E−17 | −1.945129E−16 | −1.945129E−16 |
| C4 | −3.544742E−21 | 1.689629E−22 | 9.703692E−22 | −1.379025E−20 | −1.379025E−20 |
| C5 | −2.689319E−24 | 9.802414E−27 | −2.535866E−26 | −1.501650E−26 | −1.501650E−26 |
| C6 | 1.772618E−28 | −2.612406E−31 | 2.286605E−31 | −1.600981E−28 | −1.600981E−28 |
| C7 | 0.000000E+00 | 0.000000E+00 | 0.000000E+00 | 0.000000E+00 | 0.000000E+00 |

TABLE 5-continued

NA: 1.25; Field: 26 mm × 4.9 mm; WL: 193.3 nm

| | | | | | |
|---|---|---|---|---|---|
| C8 | 0.000000E+00 | 0.000000E+00 | 0.000000E+00 | 0.000000E+00 | 0.000000E+00 |
| C9 | 0.000000E+00 | 0.000000E+00 | 0.000000E+00 | 0.000000E+00 | 0.000000E+00 |

| | SURFACE | | | | |
|---|---|---|---|---|---|
| | 41 | 43 | 45 | 48 | 53 |
| K | 0 | 0 | 0 | 0 | 0 |
| C1 | −3.218290E−08 | −1.408460E−08 | 3.765640E−08 | 1.375675E−08 | −1.293407E−08 |
| C2 | 4.089760E−13 | 3.732350E−12 | 2.045650E−12 | −1.650648E−13 | 8.171098E−14 |
| C3 | 9.461900E−17 | 5.781700E−17 | 6.726610E−17 | −7.725229E−18 | −2.315997E−17 |
| C4 | −1.126860E−20 | 4.020440E−20 | 3.357790E−21 | −8.878454E−23 | 1.220861E−21 |
| C5 | 1.093490E−24 | 1.811160E−24 | −5.515760E−25 | −3.024502E−27 | −3.871131E−26 |
| C6 | −2.303040E−29 | −3.465020E−28 | 2.958290E−28 | 7.260257E−31 | 8.195620E−31 |
| C7 | 0.000000E+00 | 0.000000E+00 | 0.000000E+00 | −3.056481E−35 | −1.127163E−35 |
| C8 | 0.000000E+00 | 0.000000E+00 | 0.000000E+00 | 5.105060E−40 | 7.656900E−41 |
| C9 | 0.000000E+00 | 0.000000E+00 | 0.000000E+00 | 0.000000E+00 | 0.000000E+00 |

| | SURFACE | |
|---|---|---|
| | 62 | 64 |
| K | 0 | 0 |
| C1 | 2.762150E−09 | −1.082280E−07 |
| C2 | −4.067930E−12 | −9.511940E−12 |
| C3 | 4.513890E−16 | 1.146050E−15 |
| C4 | −5.070740E−20 | −1.274000E−19 |
| C5 | 1.839760E−24 | 1.594380E−23 |
| C6 | −6.225130E−29 | −5.731730E−28 |
| C7 | 0.000000E+00 | 0.000000E+00 |
| C8 | 0.000000E+00 | 0.000000E+00 |
| C9 | 0.000000E+00 | 0.000000E+00 |

TABLE 6

NA: 1.55; Field: 13 mm × 5 mm; WL: 193.3 nm

| SURFACE | RADII | THICKNESSES | GLASSES | 193.368 nm | ½ DIAMETER |
|---|---|---|---|---|---|
| 0 | 0.000000 | 30.000000 | | 1.00000000 | 28.040 |
| 1 | −45.394016 AS | 6.635689 | SIO2 | 1.56049116 | 34.957 |
| 2 | 2151.515917 | 16.545348 | | 1.00000000 | 46.807 |
| 3 | −83.051561 | 28.566059 | SIO2 | 1.56049116 | 47.891 |
| 4 | −119.065543 AS | 0.500000 | | 1.00000000 | 69.316 |
| 5 | 0.000000 | 10.000000 | SIO2 | 1.56049116 | 94.621 |
| 6 | 0.000000 | 1.000000 | | 1.00000000 | 99.921 |
| 7 | 2530.299735 | 63.349995 | SIO2 | 1.56049116 | 103.248 |
| 8 | −135.649196 | 0.500000 | | 1.00000000 | 107.463 |
| 9 | 311.093341 | 39.925564 | SIO2 | 1.56049116 | 121.003 |
| 10 | −493.635417 AS | 0.500000 | | 1.00000000 | 120.604 |
| 11 | 133.444606 | 61.067502 | SIO2 | 1.56049116 | 117.509 |
| 12 | 374.542254 | 0.500000 | | 1.00000000 | 113.040 |
| 13 | 84.632149 | 51.590152 | SIO2 | 1.56049116 | 81.754 |
| 14 | 88.648479 | 25.127474 | | 1.00000000 | 63.232 |
| 15 | 307.626412 AS | 9.334872 | SIO2 | 1.56049116 | 62.312 |
| 16 | 43.760171 | 42.700144 | | 1.00000000 | 40.624 |
| 17 | −62.866922 | 7.971264 | SIO2 | 1.56049116 | 40.618 |
| 18 | −239.625085 AS | 24.317933 | | 1.00000000 | 45.475 |
| 19 | −50.648163 | 40.253476 | SIO2 | 1.56049116 | 45.709 |
| 20 | −149.875156 | 0.500000 | | 1.00000000 | 83.162 |
| 21 | −2133.410799 AS | 63.096865 | SIO2 | 1.56049116 | 100.727 |
| 22 | −125.285708 | 0.500000 | | 1.00000000 | 109.440 |
| 23 | −26011.027051 | 65.192910 | SIO2 | 1.56049116 | 140.404 |
| 24 | −203.948605 | 0.500000 | | 1.00000000 | 142.582 |
| 25 | 193.874995 | 64.570959 | SIO2 | 1.56049116 | 136.803 |
| 26 | −1131.653398 AS | 0.500000 | | 1.00000000 | 133.946 |
| 27 | 101.431520 | 69.833756 | CAF2 | 1.50110592 | 97.569 |
| 28 | 92.297418 | 0.500000 | | 1.00000000 | 69.924 |
| 29 | 70.344368 | 54.208844 | CAF2 | 1.50110592 | 63.058 |
| 30 | 43.124915 AS | 48.219058 | | 1.00000000 | 30.693 |
| 31 | −49.524613 | 19.920470 | CAF2 | 1.50110592 | 32.075 |
| 32 | 458.868681 | 67.965960 | SIO2 | 1.56049116 | 75.933 |
| 33 | −92.104256 | 0.500000 | | 1.00000000 | 83.821 |
| 34 | 518.816092 | 40.830736 | SIO2 | 1.56049116 | 130.987 |
| 35 | −593.727113 | 0.500000 | | 1.00000000 | 133.184 |

TABLE 6-continued

NA: 1.55; Field: 13 mm × 5 mm; WL: 193.3 nm

| | | | | | |
|---|---|---|---|---|---|
| 36 | 554.922603 | | 47.451002 | SIO2 | 1.56049116 | 141.932 |
| 37 | −313.882110 | AS | 54.465535 | | 1.00000000 | 142.459 |
| 38 | 0.000000 | | 10.000000 | SIO2 | 1.56049116 | 143.113 |
| 39 | 0.000000 | | 5.000000 | | 1.00000000 | 143.170 |
| 40 | 388.722555 | | 30.775375 | SIO2 | 1.56049116 | 143.454 |
| 41 | 1862.901509 | | 0.997362 | | 1.00000000 | 142.272 |
| 42 | 198.712780 | AS | 66.525407 | SIO2 | 1.56049116 | 136.261 |
| 43 | −514.840049 | | 0.500000 | | 1.00000000 | 134.178 |
| 44 | 85.045649 | | 44.185930 | SIO2 | 1.56049116 | 81.693 |
| 45 | 145.661446 | AS | 17.247660 | | 1.00000000 | 74.191 |
| 46 | 0.000000 | | −16.348223 | | 1.00000000 | 80.280 |
| 47 | 92.090812 | | 57.694536 | CAF2 | 1.50110592 | 67.945 |
| 48 | 47.458170 | AS | 1.000000 | | 1.00000000 | 28.748 |
| 49 | 38.518298 | | 19.946111 | LUAG | 2.14000000 | 25.820 |
| 50 | 0.000000 | | 3.000000 | CYCLOHEXAN | 1.65000000 | 15.292 |
| 51 | 0.000000 | | 0.000000 | CYCLOHEXAN | 1.65000000 | 7.033 |

ASPHERIC CONSTANTS

| | SURFACE | | | | |
|---|---|---|---|---|---|
| | 1 | 4 | 10 | 15 | 18 |
| K  | 0 | 0 | 0 | 0 | 0 |
| C1 | 2.222335E−06 | 2.157480E−07 | 1.213751E−08 | −7.024709E−07 | −9.624575E−07 |
| C2 | −2.960106E−10 | −3.703032E−11 | 3.933709E−12 | 1.889675E−10 | 3.626064E−10 |
| C3 | 4.099432E−14 | −7.688081E−15 | −2.029701E−16 | −3.670917E−14 | −7.017458E−14 |
| C4 | 8.830630E−18 | 1.855665E−18 | 4.960091E−21 | 7.174517E−18 | 3.203346E−17 |
| C5 | 2.738367E−21 | −2.075437E−22 | −9.428631E−26 | −1.086191E−21 | 3.301669E−21 |
| C6 | −4.634945E−24 | 2.467311E−27 | 2.722400E−30 | 7.269040E−26 | 1.937988E−25 |
| C7 | 0.000000E+00 | 0.000000E+00 | 0.000000E+00 | 0.000000E+00 | 0.000000E+00 |
| C8 | 0.000000E+00 | 0.000000E+00 | 0.000000E+00 | 0.000000E+00 | 0.000000E+00 |
| C9 | 0.000000E+00 | 0.000000E+00 | 0.000000E+00 | 0.000000E+00 | 0.000000E+00 |

| | SURFACE | | | | |
|---|---|---|---|---|---|
| | 21 | 26 | 30 | 37 | 42 |
| K  | 0 | 0 | 0 | 0 | 0 |
| C1 | −1.923992E−07 | 2.460562E−08 | 2.978434E−07 | 4.796558E−08 | −5.884188E−09 |
| C2 | 1.538439E−11 | −9.931095E−13 | −2.509878E−10 | −1.062531E−12 | −1.581977E−12 |
| C3 | −5.149355E−16 | 1.592698E−16 | −2.512252E−13 | 2.364210E−17 | −3.047715E−17 |
| C4 | −2.897216E−20 | −1.093197E−20 | −6.241269E−17 | −5.051762E−22 | 1.097254E−22 |
| C5 | 3.826170E−24 | 3.840316E−25 | −2.651403E−21 | 1.467614E−26 | 4.543670E−26 |
| C6 | −1.269936E−28 | −5.374727E−30 | −7.813369E−25 | −8.111221E−32 | −1.393249E−31 |
| C7 | 0.000000E+00 | 0.000000E+00 | 0.000000E+00 | 0.000000E+00 | 0.000000E+00 |
| C8 | 0.000000E+00 | 0.000000E+00 | 0.000000E+00 | 0.000000E+00 | 0.000000E+00 |
| C9 | 0.000000E+00 | 0.000000E+00 | 0.000000E+00 | 0.000000E+00 | 0.000000E+00 |

| | SURFACE | |
|---|---|---|
| | 45 | 48 |
| K  | 0 | 0 |
| C1 | 2.457177E−07 | −4.614167E−06 |
| C2 | −2.166219E−11 | 7.262309E−09 |
| C3 | 2.975343E−15 | −1.885463E−11 |
| C4 | −5.958384E−19 | 3.520215E−14 |
| C5 | 2.562257E−24 | −3.028402E−17 |
| C6 | 6.910021E−27 | 1.073889E−20 |
| C7 | 0.000000E+00 | 0.000000E+00 |
| C8 | 0.000000E+00 | 0.000000E+00 |
| C9 | 0.000000E+00 | 0.000000E+00 |

TABLE 7

NumAp 1.32
y' 15.16

| SURFACE | RADII | THICKNESSES | MATERIAL | INDEX | ½ DIAMETER |
|---|---|---|---|---|---|
| 0 | 0.000000 | 113.754200 | | | 60.6 |
| 1 | 0.000000 | 8.000000 | SILUV | 1.560482 | 100.5 |
| 2 | 0.000000 | 6.000000 | | | 102.2 |
| 3 | 930.923922 | 52.000000 | SILUV | 1.560482 | 106.4 |

TABLE 7-continued

NumAp 1.32
y' 15.16

| | | | | | |
|---|---|---|---|---|---|
| 4 | −256.201417 | 1.000000 | | | 110.0 |
| 5 | 164.802556 | 35.773100 | SILUV | 1.560482 | 110.4 |
| 6 | 341.545138 | 15.747900 | | | 107.3 |
| 7 | 147.535157 | 56.488000 | SILUV | 1.560482 | 97.6 |
| 8 | −647.942934 | 4.145000 | | | 91.4 |
| 9 | −536.071478 | 18.297900 | SILUV | 1.560482 | 89.4 |
| 10 | 180.585020 | 1.000000 | | | 71.6 |
| 11 | 82.247096 | 28.431900 | SILUV | 1.560482 | 64.3 |
| 12 | 121.636868 | 21.482876 | | | 56.7 |
| 13 | 0.000000 | 10.000000 | SILUV | 1.560482 | 51.2 |
| 14 | 0.000000 | 35.037652 | | | 47.0 |
| 15 | −89.601791 | 44.878000 | SILUV | 1.560482 | 50.3 |
| 16 | −203.308357 | 49.953200 | | | 72.8 |
| 17 | −333.934057 | 37.672400 | SILUV | 1.560482 | 98.4 |
| 18 | −153.471299 | 1.000000 | | | 104.5 |
| 19 | −588.427923 | 47.008300 | SILUV | 1.560482 | 113.3 |
| 20 | −177.569099 | 1.000000 | | | 116.9 |
| 21 | 1289.635452 | 32.747800 | SILUV | 1.560482 | 114.7 |
| 22 | −409.790925 | 1.000000 | | | 114.2 |
| 23 | 196.979548 | 36.289500 | SILUV | 1.560482 | 103.1 |
| 24 | 2948.592605 | 72.000000 | | | 99.3 |
| 25 | 0.000000 | −204.306500 | REFL | | 68.2 |
| 26 | 120.965260 | −15.000000 | SILUV | 1.560482 | 67.6 |
| 27 | 177.749728 | −28.181900 | | | 76.7 |
| 28 | 106.065668 | −18.000000 | SILUV | 1.560482 | 81.8 |
| 29 | 323.567743 | −34.983200 | | | 113.6 |
| 30 | 165.900097 | 34.983200 | REFL | | 119.8 |
| 31 | 323.567743 | 18.000000 | SILUV | 1.560482 | 115.6 |
| 32 | 106.065668 | 28.181900 | | | 88.3 |
| 33 | 177.749728 | 15.000000 | SILUV | 1.560482 | 87.2 |
| 34 | 120.965260 | 204.306500 | | | 79.0 |
| 35 | 0.000000 | −72.000000 | REFL | | 64.8 |
| 36 | 462.513697 | −24.493400 | SILUV | 1.560482 | 92.9 |
| 37 | 196.771640 | −1.000000 | | | 96.3 |
| 38 | −996.046057 | −27.579900 | SILUV | 1.560482 | 106.5 |
| 39 | 480.084349 | −1.000000 | | | 108.1 |
| 40 | −260.478322 | −35.771400 | SILUV | 1.560482 | 113.0 |
| 41 | −3444.700345 | −1.000000 | | | 111.8 |
| 42 | −189.044457 | −50.000000 | SILUV | 1.560482 | 107.6 |
| 43 | −630.985131 | −43.198700 | | | 99.6 |
| 44 | 675.856906 | −10.000000 | SILUV | 1.560482 | 88.6 |
| 45 | −117.005373 | −46.536000 | | | 79.9 |
| 46 | 214.318111 | −10.000000 | SILUV | 1.560482 | 79.8 |
| 47 | −191.854301 | −23.664400 | | | 93.5 |
| 48 | 1573.576031 | −31.506600 | SILUV | 1.560482 | 94.4 |
| 49 | 214.330939 | −1.000000 | | | 100.3 |
| 50 | −322.859172 | −33.185600 | SILUV | 1.560482 | 133.7 |
| 51 | −1112.917245 | −10.017200 | | | 135.5 |
| 52 | −2810.857827 | −22.000000 | SILUV | 1.560482 | 137.0 |
| 53 | −920.532878 | −42.079900 | | | 145.9 |
| 54 | 707.503574 | −62.025500 | SILUV | 1.560482 | 146.3 |
| 55 | 238.350224 | −1.000000 | | | 157.1 |
| 56 | −17926.557240 | −62.132800 | SILUV | 1.560482 | 178.0 |
| 57 | 336.363925 | −2.000000 | | | 179.9 |
| 58 | 0.000000 | −10.000000 | SILUV | 1.560482 | 179.0 |
| 59 | 0.000000 | −51.180119 | | | 178.9 |
| 60 | 0.000000 | 48.529765 | | | 178.0 |
| 61 | −303.574400 | −68.224400 | SILUV | 1.560482 | 179.0 |
| 62 | −19950.680601 | −7.986643 | | | 177.0 |
| 63 | −182.034245 | −77.612200 | SILUV | 1.560482 | 150.7 |
| 64 | −459.526735 | −1.000000 | | | 141.5 |
| 65 | −130.446554 | −49.999900 | SILUV | 1.560482 | 105.5 |
| 66 | −393.038792 | −1.000000 | | | 91.8 |
| 67 | −76.745086 | −43.335100 | SILUV | 1.560482 | 62.7 |
| 68 | 0.000000 | −1.000000 | H2OV | 1.435876 | 45.3 |
| 69 | 0.000000 | −13.000000 | SILUV | 1.560482 | 43.0 |
| 70 | 0.000000 | −3.000396 | H2OV | 1.435876 | 22.2 |
| 71 | 0.000000 | 0.000000 | | | 15.2 |

TABLE 7-continued

NumAp 1.32
y' 15.16

ASPHERIC CONSTANTS

| | | | SURFACE | | |
|---|---|---|---|---|---|
| | 9 | 17 | 24 | 43 | 47 |
| K | 0 | 0 | | 0 0 | 0 |
| C1 | −6.152794E−08 | −7.450948E−09 | 2.397578E+00 | 8 −1.544441e | 8.902497E−08 |
| C2 | 9.072358E−12 | −4.968691E−13 | −3.992688E−01 | 3 4.805552e | −4.455899E−12 |
| C3 | −7.620162E−16 | −1.804573E−17 | 7.587147E−01 | 8 −6.813171e | 3.521620E−16 |
| C4 | 2.116045E−20 | 1.214276E−21 | −4.079078E−02 | 3 −4.666592e | −2.121932E−20 |
| C5 | 2.963576E−24 | 5.493721E−27 | −1.807190E−02 | 6 1.242732e | 2.642521E−25 |
| C6 | −3.075337E−28 | −5.299803E−30 | 1.560768E−03 | 0 −9.557499e | 1.245058E−28 |
| C7 | 9.068617E−33 | 1.870242E−34 | −4.466502E−03 | 5 2.284660e | −6.144810E−33 |

| | | | SURFACE | | |
|---|---|---|---|---|---|
| | 48 | 51 | 53 | 54 | 64 | 66 |
| K | 0 | 0 | | 0 0 | 0 | 0 |
| C1 | 2.768189E−08 | 1.787600E−08 | −3.738135E+00 | 8 1.728194e | 3.264015E−08 | −6.538685E−08 |
| C2 | −1.657627E−12 | −3.785102E−13 | −8.195730E−01 | 3 −6.690131e | −2.291400E−12 | −1.101880E−13 |
| C3 | 1.596547E−17 | −9.909771E−17 | 1.196846E−01 | 6 1.379584e | 1.419559E−16 | −2.522891E−16 |
| C4 | −5.508505E−21 | 4.442167E−21 | −2.578914E−02 | 1 −5.773921e | −6.671541E−21 | 2.782014E−20 |
| C5 | 5.521223E−25 | −1.566662E−25 | −3.008537E−02 | 6 1.736082e | 2.032317E−25 | −3.073204E−24 |
| C6 | −1.359008E−28 | 6.868774E−30 | 1.836351E−03 | 0 −3.718468e | −3.619015E−30 | 1.726081E−28 |
| C7 | 8.927631E−33 | −1.167559E−34 | −2.233659E−03 | 5 6.530703e | 2.871756E−35 | −5.631877E−33 |

What is claimed is:

1. A projection objective, comprising:

an optical arrangement of optical elements between an object plane of the projection objective and an image plane of the projection objective, the optical arrangement having at least one intermediate image plane, the optical arrangement, comprising:

a first correction element arranged optically at least in the vicinity of a pupil plane of the projection objective; and a second correction element arranged in a region which is not optically near any pupil plane of the projection objective or any field plane of the projection objective, wherein the projection objective is configured to be used as a lithographic projection objective.

2. The projection objective of claim 1, wherein the position of the first correction element is selected such that the absolute value of a ratio of principal-ray height to marginal-ray height at this position is less than 1/n, where n equals 5, 10 or 20.

3. The projection objective of claim 1, wherein the position of the second correction element is selected such that the absolute value of a ratio of principal-ray height to marginal-ray height at this position is greater than 1/m, but less than p/10, where m equals 5, 10 or 20, and p equals 17, 20, 25, 35 or 55.

4. The projection objective of claim 1, wherein, seen in the light propagation direction, the arrangement of optical elements further comprises:

a first subassembly capable of imaging the object plane via a first pupil plane of the projection objective into the at least one intermediate image plane; and a second subassembly capable of imaging the at least one intermediate image plane via a second pupil plane of the projection objective into the image plane, wherein:

the first correction element is arranged optically at least in the vicinity of the second pupil plane;

the second correction element is arranged downstream of the at least one intermediate image plane;

the second correction element is arranged upstream of the second pupil plane; and the second correction element is not optically near either the at least one intermediate image plane or the second pupil plane.

5. The projection objective of claim 1, wherein, seen in the light propagation direction, the arrangement of optical elements further comprises:

a first subassembly capable of imaging the object plane via a first pupil plane of the projection objective into the at least one intermediate image plane; and a second subassembly capable of imaging the at least one intermediate image plane via a second pupil plane of the projection objective into the image plane, wherein:

the first correction element is arranged optically at least in the vicinity of the second pupil plane;

the second correction element is arranged upstream of the first pupil plane; and the second correction element is not optically near either the object plane or the first pupil plane.

6. The projection objective of claim 1, wherein the at least one intermediate image plane includes first and second intermediate image planes, and seen in the light propagation direction, the arrangement of optical elements further comprises:

a first subassembly capable of imaging the object plane via a first pupil plane of the projection objective into the first intermediate image plane;

a second subassembly capable of imaging the first intermediate image plane via a second pupil plane of the projection objective into the second intermediate image plane; and a third subassembly capable of imaging the second intermediate image plane via a third pupil plane of the projection objective into the image plane, wherein:
the first correction element is arranged optically at least in the vicinity of the first pupil plane;
the second correction element is arranged between the first pupil plane and the first intermediate image plane; and
the second correction element is not optically near either the first pupil plane or the first intermediate image plane.

7. The projection objective of claim 1, wherein the at least one intermediate image plane includes first and second intermediate image planes, and seen in the light propagation direction, the arrangement of optical elements further comprises:
a first subassembly capable of imaging the object plane via a first pupil plane of the projection objective into the first intermediate image plane;
a second subassembly capable of imaging the first intermediate image plane via a second pupil plane into the second intermediate image plane; and
a third subassembly capable of imaging the second intermediate image plane via a third pupil plane of the projection objective into the image plane, wherein:
the first correction element is arranged optically at least in the vicinity of the first pupil plane;
the second correction element is arranged between the object plane and the first pupil plane; and
the second correction element is not optically near either the object plane or the first pupil plane.

8. The projection objective of claim 7, wherein a third correction element is arranged optically at least in the vicinity of the third pupil plane.

9. The projection objective of claim 1, wherein the at least one intermediate image plane includes first and second intermediate image planes, and seen in the light propagation direction, the arrangement of optical elements further comprises:
a first subassembly capable of imaging the object plane via a first pupil plane of the projection objective into a first intermediate image plane;
a second subassembly capable of imaging the first intermediate image plane via a second pupil plane of the projection objective into a second intermediate image plane; and
a third subassembly capable of imaging the second intermediate image plane via a third pupil plane of the projection objective into the image plane, wherein:
the first correction element is arranged optically at least in the vicinity of the third pupil plane;
the second correction element is arranged between the object plane and the first pupil plane; and
the second correction element is not optically near either the object plane or the first pupil plane.

10. The projection objective of claim 1, wherein, seen in the light propagation direction, the arrangement of optical elements further comprises:
a first subassembly capable of imaging the object plane via a first pupil plane of the projection objective into the at least one intermediate image plane; and
a second subassembly capable of imaging the at least one intermediate image plane into the image plane, wherein:
the first correction element is arranged optically at least in the vicinity of the first pupil plane;
the second correction element is arranged between the object plane and the first pupil plane; and
the second correction element is not optically near the object plane nor the first pupil plane.

11. The projection objective of claim 1, wherein the optical arrangement comprises precisely two correction elements or three correction elements.

12. The projection objective of claim 1, wherein at least one of the correction elements can be exchanged during the operation of the projection objective.

13. The projection objective of claim 1, wherein at least one of the correction elements is a plane plate.

14. The projection objective of claim 1, wherein at least one of the correction elements has an aspherization.

15. The projection objective of claim 1, wherein at least one of the correction elements can be actively deformed.

16. The projection objective of claim 1, wherein at least one of the correction elements can be thermally manipulated.

17. The projection objective of claim 1, wherein at least one of the correction elements can be adjusted in position.

18. A machine, comprising:
the projection objective of claim 1,
wherein the machine is a lithographic projection exposure machine.

19. A method, comprising:
using the projection of objective of claim 1 to produce a semiconductor.

20. The method of claim 19, comprising using the projection objective to image a reticle onto a substrate.

* * * * *

UNITED STATES PATENT AND TRADEMARK OFFICE
CERTIFICATE OF CORRECTION

| | |
|---|---|
| PATENT NO. | : 8,068,276 B2 |
| APPLICATION NO. | : 12/899297 |
| DATED | : November 29, 2011 |
| INVENTOR(S) | : Heiko Feldmann et al. |

Page 1 of 1

It is certified that error appears in the above-identified patent and that said Letters Patent is hereby corrected as shown below:

Column 7, Line 52, delete "correaction" insert --correction--.

Signed and Sealed this
Thirty-first Day of January, 2012

David J. Kappos
*Director of the United States Patent and Trademark Office*